(12) United States Patent
Asano et al.

(10) Patent No.: US 7,439,655 B2
(45) Date of Patent: Oct. 21, 2008

(54) LAMINATED-TYPE PIEZOELECTRIC ELEMENT

(75) Inventors: Hiroaki Asano, Yokkaichi (JP); Hidekazu Hattori, Nagoya (JP); Yoichi Kobane, Kuwana (JP)

(73) Assignee: Denso Corporation (JP)

( * ) Notice: Subject to any disclaimer, the term of this patent is extended or adjusted under 35 U.S.C. 154(b) by 146 days.

(21) Appl. No.: 11/405,493

(22) Filed: Apr. 18, 2006

(65) Prior Publication Data

US 2006/0232172 A1 Oct. 19, 2006

(30) Foreign Application Priority Data

Apr. 18, 2005 (JP) .............................. 2005-120386

(51) Int. Cl.
*H01L 41/08* (2006.01)
(52) U.S. Cl. ...................................... 310/328; 310/364
(58) Field of Classification Search ................. 310/328, 310/363, 364, 366
See application file for complete search history.

(56) References Cited

U.S. PATENT DOCUMENTS

| 6,507,140 B1 | 1/2003 | Heinz et al. | |
| 6,573,639 B1 * | 6/2003 | Heinz et al. | 310/363 |
| 6,700,306 B2 * | 3/2004 | Nakamura et al. | 310/328 |
| 7,061,162 B2 * | 6/2006 | Sato et al. | 310/328 |
| 2001/0033125 A1 * | 10/2001 | Takao et al. | 310/366 |

FOREIGN PATENT DOCUMENTS

| JP | 8-242025 | 9/1996 |
| JP | 2002-9356 | 1/2002 |

OTHER PUBLICATIONS

Chinese Office Action dated Apr. 25, 2008 issued in counterpart Chinese Application No. 200610073658.0 with English translation.

* cited by examiner

*Primary Examiner*—Mark Budd
(74) *Attorney, Agent, or Firm*—Nixon & Vanderhye PC

(57) ABSTRACT

A laminated-type piezoelectric element 1 is provided, which comprises a first external electrode layer 33, which is located at a side area of the laminated-type piezoelectric element 1, is electrically continuous to internal electrode layers 21, and comprises plural expansible and contractible opening portions 33a in a stacking direction of the laminated-type piezoelectric element 1. As the first external electrode layer 33 is connected to the laminated-type piezoelectric element 1 with an electrically conductive adhesive member 32 and the electrically conductive adhesive member 32 is narrower than the first external electrode layer 33, the electrically conductive adhesive member 32 penetrates into the opening portions 33a of the first external electrode layer 33 to form connections in a shape of an anchor. Therefore, the first external electrode layer 33 is firmly connected to the laminated-type piezoelectric element 1.

20 Claims, 16 Drawing Sheets

LAMINATED-TYPE PIEZOELECTRIC ELEMENT

TECHNICAL FIELD

The present invention relates to a laminated-type piezoelectric element utilized in, for example, an injection valve for injecting fuel in an automobile, a finely-positioning device of an optical device and the like, a driving element for preventing vibration, and an ink-jet printer.

BACKGROUND ART

In recent years, in order to secure a large amount of displacement in an small piezoelectric actuator under a high pressure, a strong electric field has been applied to the piezoelectric actuator and it has been continuously driven or a long period.

In a laminated-type piezoelectric element utilized in such a piezoelectric actuator, when it has been continuously driven under a strong electric field and a high pressure for a long period, external electrodes for a positive electrode and a negative electrode disposed at side areas of the laminated-type piezoelectric element cannot follow movements of expansion and contraction of the laminated-type piezoelectric element. Therefore, peeling occurs between the internal electrode formed between piezoelectric bodies and the external electrode, or a crack occurs at the external electrode and the external electrode breaks. Thereby, a problem occurs where an electric voltage is not supplied to a part of the piezoelectric body, and the displacement properties change during driving.

Therefore, Japanese unexamined patent publication No. 8-242025 proposes a laminated-type piezoelectric element wherein a thin sheet of an electrically conductive material, where a notch was formed in a width direction, is connected to a side area of the laminated-type piezoelectric element with an electrically conductive adhesive so as to make the thin sheet of an electrically conductive material electrically continuous with an internal electrode.

SUMMARY OF INVENTIONS

However, in the prior art described in Japanese unexamined patent publication No. 8-242025, as the laminated-type piezoelectric element and the thin sheet of an electrically conductive material are connected by the electrically conductive adhesive of which the connecting strength is generally weak in comparison with soldering or brazing, there has been a problem where the connecting strength and its durability are inferior. Although the connection has an effect on a stress applied to the notch portion formed on the thin sheet of an electrically conductive material, the stress cannot be sufficiently reduced, and the thin sheet of an electrically conductive material breaks because the other parts than the notch portion are fixed with the electrically conductive adhesive. Further, as the electrical conductivity between the thin sheet of an electrically conductive material and the internal electrode cannot be secured due to the breaking of the thin sheet of an electrically conductive material, there is a problem where the displacement properties change during driving. The present invention has been achieved of by considering such problems. A purpose of the present invention is to provide a laminated-type piezoelectric element which offers an effect that the connecting strength between the internal electrode formed in the piezoelectric body and the external electrode is high even if an electrically conductive adhesive is utilized, and displacement properties do not easily change during driving even if a part of the external electrode breaks.

The present invention provides a laminated-type piezoelectric element, comprising piezoelectric layers composed of a ceramic being expansible and contractible by an applied electric voltage, internal electrode layers which are stacked alternately with the piezoelectric layers to form the laminated-type piezoelectric element and to supply the electric voltage to the piezoelectric layers, and first external electrode layers which are disposed on side areas of the laminated-type piezoelectric element, are electrically continuous to the internal electrode layers, and comprise plural opening portions being expansible and contractible in a stacking direction of the laminated-type piezoelectric element, wherein the first external electrode layer is connected to the laminated-type piezoelectric element via an electrically conductive adhesive member, and a width of the electrically conductive adhesive member is narrower than a width of the first external electrode layer.

Thereby, although an adhering strength of the electrically conductive adhesive member is generally weak in comparison with soldering or brazing, the first external electrode layer strongly connects to the laminated-type piezoelectric element, as the electrically conductive adhesive member penetrates into the opening portion of the first external electrode layer to form a connection in the shape of an anchor. Further, as the width of the electrically conductive adhesive member is narrower than the width of the first external electrode layer, the electrical conductivity for the internal electrode layers can be secured by a part of the first external electrode layer which is not fixed to the electrically conductive adhesive member, even when a part of the first external electrode layer fixed to the electrically conductive adhesive member is broken by a displacement of the piezoelectric layers and the like. Therefore, the laminated-type piezoelectric element can be provided, where the connecting strength between the internal electrode layers formed at the laminated-type piezoelectric element and the first external electrode layer is high, and the displacement properties do not easily change even if a part of the first external electrode layer was broken.

According to the present invention of claim 2, the laminated-type piezoelectric element is provided, where the width of the electrically conductive adhesive member is not less than 0.3 mm. Thereby, the connecting strength is sufficiently high for the laminated-type piezoelectric element, even if the adhesive with the adhering strength of not greater than 20 MPa.

According to the invention of claim 3, the laminated-type piezoelectric element is provided, where a maximum width of the opening portion in a perpendicular direction to the stacking direction of the laminated-type piezoelectric element is not greater than 0.5 Wm, wherein Wm represents the width of the first external electrode layer. Thereby, the electrical conductivity to the internal electrode layers can be secured by a part of the first external electrode layer which is not fixed to the electrically conductive adhesive member, even when a part of the first external electrode layer fixed to the electrically conductive adhesive member is broken. In other words, the electrical conductivity to the internal electrode layers can be secured by a side forming at least one opening portion.

According to the invention of claim 4, the laminated-type piezoelectric element is provided, where a shape of the opening portion is a circle or an ellipse. Thereby, the first external electrode layer seldom breaks because the opening portion has a shape with no angle where a stress due to the displacement of the piezoelectric layers and the like does not easily concentrate.

According to the invention of claim 5, the laminated-type piezoelectric element is provided, where a shape of the opening portion is a polygon rounded at corners. Thereby, the first external electrode layer seldom breaks because the opening portion has a rounded shape where a stress due to the displacement of the piezoelectric layers and the like does not easily concentrate.

According to the invention of claim 6, the laminated-type piezoelectric element is provided, where a shape of the opening portion is a quadrangle or a lozenge, further especially where a width Ws of the electrically conductive adhesive member is represented by the following formula, $$Ws < Wm - h$$

wherein Wm represents a width of the first external electrode layer, and h represents a height of a triangle with three sides of "a", "b" and "$L_2$", wherein "a" and "b" represent respectively lengths of two sides adjoining to each other in the stacking direction at the opening portion formed in the shape of a quadrangle or a lozenge, and "$L_2$" represents a width of the opening portion in the stacking direction of the laminated-type piezoelectric element. Thereby, the electrical conductivity for the internal electrode layers can be secured by a part of the first external electrode layer which is not fixed to the electrically conductive adhesive member, even when a part of the first external electrode layer fixed to the electrically conductive adhesive member is broken by a displacement of the piezoelectric layers. In other words, the electrical conductivity to the internal electrode layers can be secured by the side of "a" and the side of "b" forming at least one opening portion.

According to the invention of claim 8, the laminated-type piezoelectric element is provided, where a relation among three sides of the triangle is represented by the following formula, $$a + b > L_2 \times \alpha$$

wherein α represents an extensibility (maximum extension/total length) of the laminated-type piezoelectric element in the stacking direction. Thereby, the first external electrode layer cannot be easily broken by the extension of the piezoelectric body, because of the relation $a+b>L_2\times\alpha$.

Further, according to the invention of claim 9, it is preferred that a maximum extensibility (maximum extension/total length) of the laminated-type piezoelectric element in the stacking direction is not greater than 0.012.

According to the invention of claim 10, the laminated-type piezoelectric element is provided, where the first external electrode layer is composed of a metal composed of at least one metal selected from stainless steel, copper, silver, iron and nickel, or an alloy thereof. Thereby, the first external electrode layer with the high strength can be formed.

Further, according to the invention of claim 11, the laminated-type piezoelectric element is provided, wherein a non-opening portion, where the opening portion is not formed, is formed at an end portion of the first external electrode layer. Thereby, the connection with an outer device can be made easy.

According to the invention of claim 12, the laminated-type piezoelectric element is provided, wherein a second external electrode layer intervenes between the electrically conductive adhesive member and the first external electrode layer, especially wherein the second external electrode layer is composed of a metal composed of at least one metal selected from silver, palladium, platinum, copper, gold and nickel, or an alloy thereof. Thereby, a thermal stress applied from the piezoelectric layers to the first external electrode layer can be decreased in comparison with a case where the first external electrode layer is directly connected to the piezoelectric layers, because a coefficient of thermal expansion of the second external electrode layer is between the coefficients of thermal expansion of the piezoelectric layer and the first external electrode layer, and functions as a layer for the relaxation of a thermal stress.

According to the invention of claim 14, the laminated-type piezoelectric element is provided, wherein an insulating resin member intervenes in a gap between the first external electrode layer and the internal electrode layer, which is formed so that the width of the electrically conductive adhesive member is narrower than the width of the first external electrode layer, especially wherein the insulating resin member is composed of a silicone resin, an epoxy resin, a urethane resin, a polyimide resin, a polyamideimide resin or a polyester resin. Thereby, phenomena of electrical discharge caused by repeating electrical conductivity between the first external electrode layer and the internal electrode layer can be prevented, because an electrical insulation can be formed between the first external electrode layer and the internal electrode layer there.

According to the present invention of claim 16, the laminated-type piezoelectric element is provided, where the laminated-type piezoelectric element is formed by connecting laminated-type piezoelectric units. Even in such a manner, the present invention can provides the laminated-type piezoelectric element where the connecting strength between the internal electrode layers formed in the laminated-type piezoelectric element and the first external electrode layer is high, and displacement properties do not easily change even if a part of the first external electrode layer was broken.

If the laminated-type piezoelectric element is utilized for a fuel injection device according to the present invention of claim 17, the fuel injection device with an excellent durability can be provided, because the connecting strength between the internal electrode layers formed in the laminated-type piezoelectric element and the first external electrode layer is high, and displacement properties do not easily change even if a part of the first external electrode layer was broken.

DETAILED DESCRIPTION (Summary)

Figure 1:
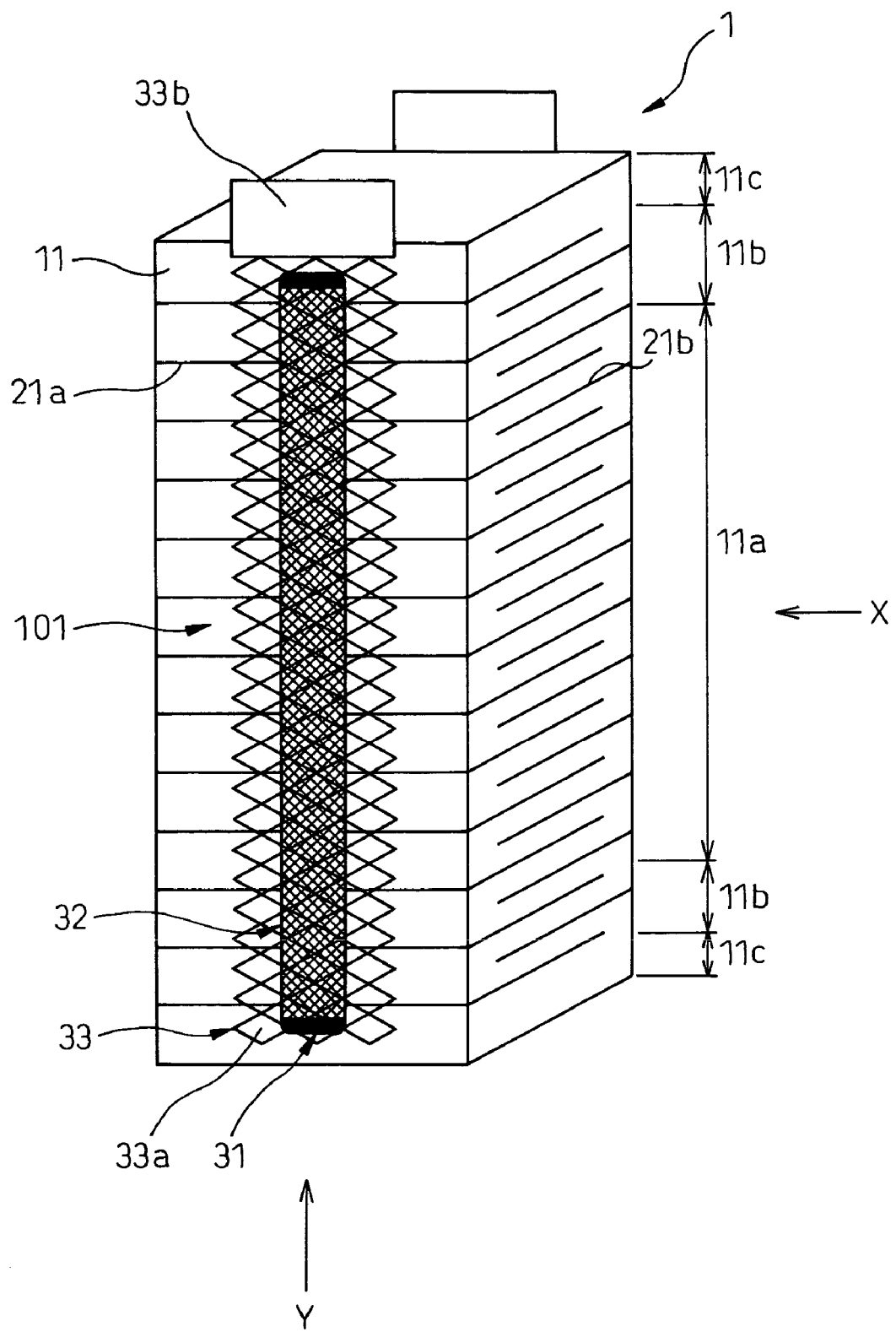
FIG. 1 shows a drawing to illustrate a constitution of a laminated-type piezoelectric element of an Embodiment of the present invention.

A constitution of an Embodiment of the first present invention is illustrated as follows according to Figures. FIG. 1 is a drawing to illustrate a constitution of a laminated-type piezoelectric element of the Embodiment of the present invention. As shown in FIG. 1, the laminated-type piezoelectric element 1 of this Example comprises, divided broadly, piezoelectric layers 11, internal electrode layers 21a and 21b, second external electrode layers 31, electrically conductive adhesive members 32, first external electrode layers 33 and insulating resin members 34, and is constituted as follows. The laminated-type piezoelectric element 1 is formed by stacking alternately plural piezoelectric layers 11 composed of a ceramic material PZT expansible and contractible by an applied electric voltage and plural internal electrode layers 21 for supplying the applied electric voltage. On external periphery side areas 101, the second external electrode layers 31 being electrically continuous are disposed so that the internal electrode layers 21a and the internal electrode layers 21b become different electrodes respectively. On the second external electrode layer 31, the first external electrode layer 33 is formed through the electrically conductive adhesive member 32. The first external electrode layer 33 comprises plural expansible and contractible opening portions 33a. Further, the insulating resin member 34 intervenes between the external periphery side area 101 and the first external electrode layer 33 of the laminated-type piezoelectric element 1, and prevents phenomena of a spark discharge caused by repeating electrical conductivity between the first external electrode layer 33 and the internal electrode layers 21a, 21b.

Characteristic parts in the present invention are then illustrated as follows. The first external electrode layer 33 comprises the plural expansible and contractible opening portions 33a. As the electrically conductive adhesive member 32 can penetrate into the opening portions 33a of the first external electrode layer 33 and form connections in the shape of an anchor, the second external electrode layer 31 and the first external electrode layer 33 are strongly connected, even if an electrically conductive adhesive generally having a weak connecting strength, in comparison with soldering or brazing, is used. As the width of the electrically conductive adhesive member 32 is narrower than the width of the first external electrode layer 33, the electrical conductivity for the internal electrode layers 21a and 21b can be secured by a part of the first external electrode layer 33 which is not fixed to the electrically conductive adhesive members 32, even when a part of the first external electrode layer 33 fixed to the electrically conductive adhesive members 32 was broken by the displacement of the piezoelectric layers and the like. Therefore, the laminated-type piezoelectric element can be provided, where the connecting strength between the internal electrode layers 21a, 21b formed at the piezoelectric layers 11 and the first external electrode layer 33 is high, and displacement properties do not easily change even if a part of the first external electrode layer 33 was broken.

(Details)

The details of the present invention are described as follows. As shown in FIG. 1, the laminated-type piezoelectric element 1 is formed so that the internal electrode layers 21a and 21b can be made alternately positive and negative between the piezoelectric layers 11. The internal electrode layers 21a are disposed so as to be exposed at one external periphery side area 101, while the internal electrode layers 21b are disposed so as to be exposed at the other external periphery side area (not shown in FIG. 1). At the external periphery side areas 101 of the laminated-type piezoelectric element 1, the second external electrode layers 31 composed of a baked silver are formed so as to make end portions of the exposed internal electrode layers 21 electrically continuous. The baked silver configuring the second external electrode layer 31 is an electrode made by baking an Ag paste, and has a composition including Ag at 97% and a glass-frit component at 3%. The second external electrode layer 31 can be formed by vapor-deposition or plating, and not by baking.

On the second external electrode layer 31, the first external electrode layer 33 is disposed through the electrically conductive adhesive member 32. The electrically conductive adhesive member 32 and the first external electrode layer 33 are further described later.

At the first external electrode layer 33, a non-opening portion 33b for supplying the applied electric voltage from outside to the laminated-type piezoelectric element 1 is formed. Further, a part for connecting with an outer electric source, which corresponds to the non-opening portion 33b, can be varied as appropriate based on a design, and may be formed, for example, at the second external electrode layers 31.

In the laminated-type piezoelectric element 1, a central part in the stacking direction was formed as a driving portion 11a, parts sandwiching the driving portion 11a were formed as buffer portions 11b, and parts sandwiching the buffer portions 11b were further formed as dummy portions 11c. Thereby, they are configured so that an amount of expansion and contraction decreases, during application of an electric voltage, in order of the driving portion 11a, the buffer portion 11b and the dummy portion 11c. Concretely, the thicknesses of the piezoelectric layers 11 are made thicker in order, and the internal electrode layer is not formed at an upper area of the upper dummy portion 11c and a lower area of the lower dummy portion 11c. Thus, as internal stresses can be relaxed in stages, a crack is not easily formed, and the laminated-type piezoelectric element 1 can be used for a long period.

A manufacturing method and a detailed structure of this laminated-type piezoelectric element 1 are explained as follows. The laminated-type piezoelectric element 1 of this Example can be manufactured by utilizing a green-sheet method which is widely used. Powders of lead oxide, zirconium oxide, titanium oxide, niobium oxide, strontium oxide or the like, which becomes a main source of a piezoelectric material, are weighed to make a desired composition. Considering vaporization of the lead, the lead oxide is formulated so as to enrich it at 1-2% more than a stoichiometric ratio of the mixed composition. The composition is dry-mixed with a mixer, and then is partly calcined at 800-950° C.

Water and a dispersant are added to the partly calcined powder to make slurry, and then the slurry is water-ground with a purl-mill. After that, the ground slurry is deaerated in a vacuum device, while being stirred, to adjust its viscosity.

A green sheet with a uniform thickness is then formed from the slurry, using a doctor-blade device. The obtained green sheet is punched with a pressing machine, or is cut by a cutting machine to form pieces of a specified size. The green sheet is utilized commonly for the driving portion, the buffer portion and the dummy portion.

A pattern is formed on one surface of the formed green sheet by screen-printing, for example, with a paste of silver and palladium having a silver/palladium ratio of 7/3 by weight (herein after referred to as Ag/Pd paste).

On an approximately entire surface of the green sheet to become the piezoelectric layer 11, a relatively smaller pattern than a surface of the piezoelectric layer 11 is formed with the Ag/Pd paste to obtain the internal electrode layers 21a and 21b. At one side of opposing sides of the surface of the green sheet, a portion is disposed where the internal electrode layer 21a (21b) is not formed. In other words, the portion is disposed so that the internal electrode layer 21a (21b) does not reach to one end portion of opposing sides of the surface of the green sheet (a part corresponding to one side area 101 or an opposing area of the laminated-type piezoelectric element 1), while the internal electrode layer 21a (21b) can reach to the other end portion of the opposing sides.

A specified number of the green sheets, on which such internal electrode layers 21a and 21b were formed, are prepared for the driving portion 11a and the buffer portion 11b, based on a required specification of an amount of the displacement. A necessary number of the green sheets, on which an internal electrode layer is not printed, also are prepared for the buffer portion 11b and the dummy portion 11c.

These green sheets are then stacked. When the green sheets, where electrode layers 21a and 21b were formed, are stacked, they are stacked so that portions where no electrode was formed can be disposed alternately at one side area 101 and the opposing side area of the laminated-type piezoelectric element 1. Thereby, the internal electrode layer 21a exposed at one side area 101 of the green sheet becomes an internal electrode for one pole at the side area, while the internal electrode layer 21b exposed at the opposing side area becomes an internal electrode for another pole at the opposing side.

The central driving portion 11a is formed by stacking only green sheets where the internal electrode layers 21a and 21b were formed, the buffer portions 11b are formed by stacking green sheets via intervening a green sheet, where no internal electrode was formed, between green sheets, and the dummy portions 11c are formed by stacking only green sheets where no internal electrode was formed. Thereby, a laminate body with a structure shown in FIG. 1 is obtained.

Next, after thermally bonding in a press, by rubber-pressing with warm water and the like, the laminate body is degreased at 400-700° C. using an electric oven, and is calcined at 900-1200° C. The second external electrode layer 31 is then formed by applying and baking the Ag paste on the side area of the laminate body. Although the second external electrode layer 31 was formed using the baked Ag in this Example, it also may be formed by baking, for example, a paste of Ag/Pd, Pt, Cu, Ni, Au or the like. Silver, copper, nickel, platinum, gold and the like other than the above-mentioned materials may be utilized as a material for the internal electrode layers 21a and 21b.

The second external electrode layer 31 is formed at a position where the internal electrode layers 21a for one pole are exposed, to make electrical conductivity with each internal electrode layer 21a. The second external electrode layer 31 disposed on the opposing side area (not shown in the Figure) is formed at a position, where the internal electrode layers 21b for another pole are exposed, to make electrical conductivity with each of the internal electrode layers 21b. The electrically conductive adhesive members 32 are then applied on the second external electrode layers 31. The first external electrode layers 33 are pressed to the electrically conductive adhesive members 32. The laminated-type piezoelectric element 1 is then immersed into an insulating oil, and a direct electric current is applied between the internal electrode layers 21a and 21b from the non-opening portion 33b of the first external electrode layer 33 to polarize the piezoelectric layers 11. Thus, the laminated-type piezoelectric element 1 is obtained.

(Characterized portions of the present invention)

Figure 2A:
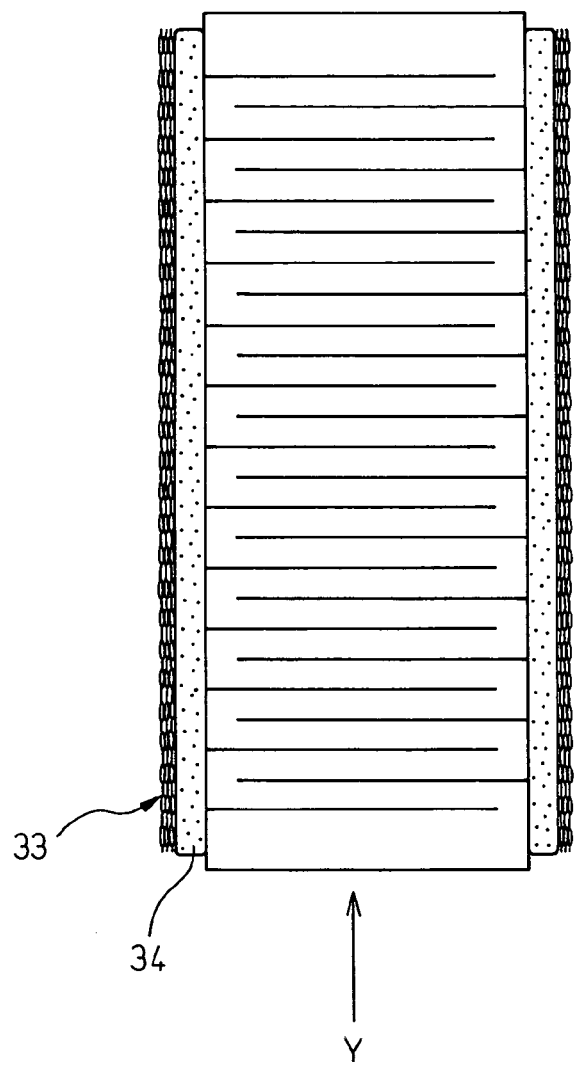
FIG. 2(a) shows a drawing to illustrate a view of the laminated-type piezoelectric element in a direction of an arrow X of the laminated-type piezoelectric element in FIG. 1.
Figure 2B:
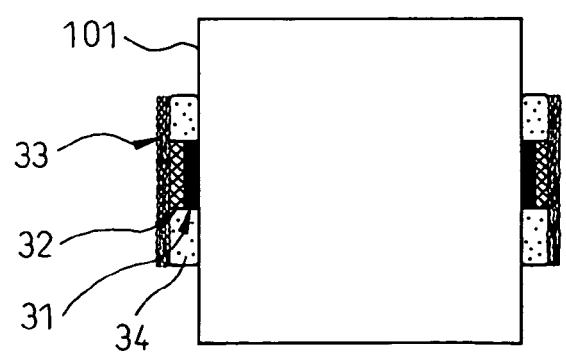
FIG. 2(b) shows a drawing to illustrate a view of the laminated-type piezoelectric element in a direction of an arrow Y of the laminated-type piezoelectric element in FIG. 1.

FIG. 2(a) is a drawing to illustrate a view of the laminated-type piezoelectric element 1 in a direction of an arrow X of FIG. 1, and FIG. 2(b) is a drawing to illustrate a view laminated-type piezoelectric element 1 in a direction of an arrow Y of FIG. 1. As shown in FIGS. 2(a), 2(b), the electrically conductive adhesive members 32 is disposed between the second external electrode layers 31 and the first external electrode layers 33 to connect them.

The first external electrode layers 33 is composed of stainless steel, copper, iron, nickel or an alloy thereof, and is formed with the opening portions 33a in a shape of a lozenge. As a method for forming the opening portions 33a, a punching process, an etching process, a laser process, a method for forming a sheet in a shape of a lattice by making a notch at a metal plate and stretching the plate or the like can be utilized. At an end portion of the first external electrode layer 33, the non-opening portion 33b is formed, where no opening portion is formed.

The insulating resin members 34 is composed of a silicone resin, an epoxy resin, a urethane resin, a polyimide resin, a polyamideimide resin or a polyester resin, and is formed between the internal electrode layers 21a, 21b and the first external electrode layers 33 disposed in the laminated-type piezoelectric element 1 to prevent phenomena of a spark discharge caused by repeated electrical conductivity between the first external electrode layer 33 and the internal electrode layers 21a, 21b.

Figure 3:
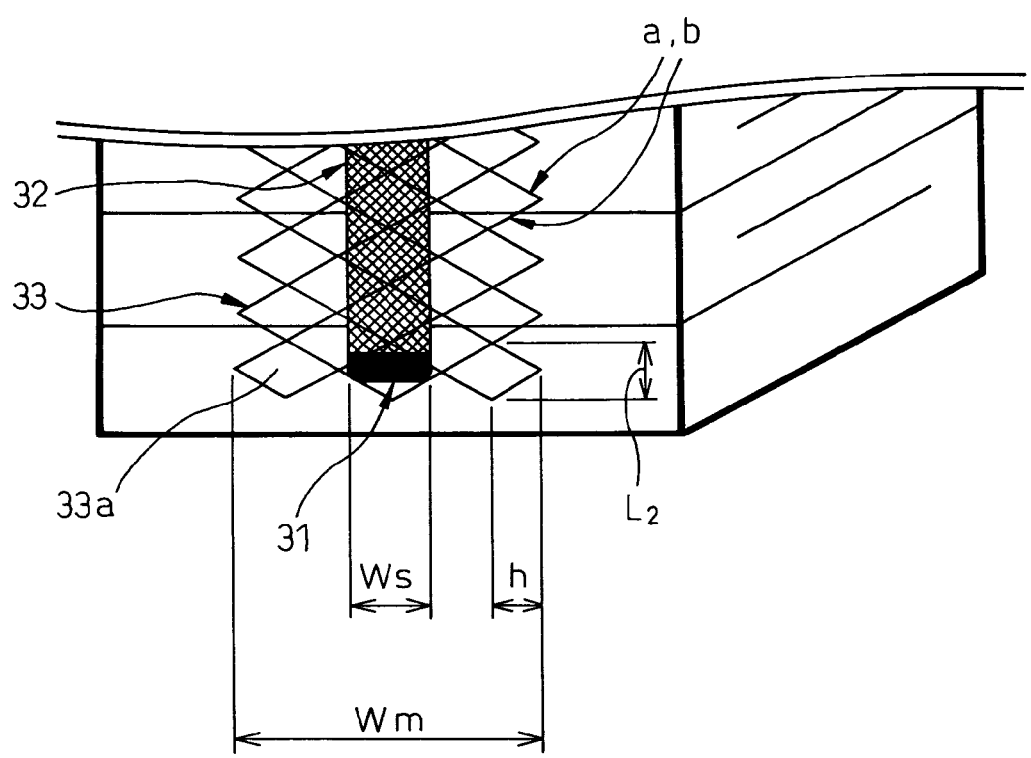
FIG. 3 shows a drawing to illustrate an enlarged view of a main part in FIG. 1.

FIG. 3 is a drawing to illustrate an enlarged view of a main part in FIG. 1. A characteristic of the present invention is that the width Ws of the electrically conductive adhesive member 32 is narrower than the width Wm of the first external electrode layer 33. The width Ws of the electrically conductive adhesive member 32 in this Embodiment is about 1 mm. The width Ws of the electrically conductive adhesive members 32 is not limited in this Embodiment. Concretely, when the width is not less than 0.3 mm, an adhering strength is sufficient, even if a common adhesive with the adhering strength at not greater than 30 MPa at the greatest is utilized. A method for measuring the adhering strength will be described later. The adhering strength can be defined as follows. Namely, when "a" and "b" represent respectively lengths of two sides adjoining each other at the opening portion 33a formed approximately in a shape of a quadrangle, $L_2$ represents a width of the opening portion 33a in the stacking direction of the laminated-type piezoelectric element 1, h represents a height of a triangle with three side lengths of "a", "b" and "$L_2$", and Wm represents a width of the first external electrode layer 33, a width Ws of the electrically conductive adhesive member 32 is represented by the following formula.

$$Ws < Wm - h$$

Thereby, the electrical conductivity for the internal electrode layers 21a and 21b can be secured by a part of the first external electrode layer 33 which is not fixed to the electrically conductive adhesive member 32, even when a part of the first external electrode layer 33 fixed to the electrically conductive adhesive member 32 was broken. In other words, the electrical conductivity for the internal electrode layers 21a and 21b can be secured by the sides of "a" and "b" forming at least one opening portion 33a.

Further, when a represents extensibility (maximum extension/total length) of the laminated-type piezoelectric element 1 in the stacking direction, a relation among three sides of the triangle is represented by the following formula.

$$a + b > L_2 \times \alpha$$

Thereby, the first external electrode layer 33 cannot be easily broken by the extension of the laminated-type piezoelectric element 1. The extensibility of the laminated-type piezoelectric element 1 in this Embodiment is approximately in a range of 0.001-0.002. In other words, for example, when a total length of the laminated-type piezoelectric element 1 is 50 mm, and the maximum extension is 0.05 mm, the extensibility is 0.001. The extensibility of the laminated-type piezoelectric element 1 is not limited by this Example. When the extensibility of the laminated-type piezoelectric element 1 is not greater than 0.012, it is thought that the first external electrode layer 33 is not easily broken by the extension of the laminated-type piezoelectric element 1.

When Wm represents the width of the first external electrode layer 33, the width of the opening portion 33a in a perpendicular direction to the stacking direction of the laminated-type piezoelectric element 1 is not greater than 0.5 Wm. Thereby, even if one opening portion 33a formed at the first external electrode layer 33 is fixed with the electrically conductive adhesive member 32, the other opening portion 33a can be made in a state of not being fixed with the electrically conductive adhesive member 32. Therefore, the electrical conductivity for the internal electrode layers 21a and 21b can be secured by a part of the first external electrode layer 33 which is not fixed to the electrically conductive adhesive member 32, even when a part of the first external electrode layer 33 fixed to the electrically conductive adhesive member 32 was broken. In other words, the electrical conductivity for the internal electrode layers 21a and 21b can be secured by the side forming at least one opening portion 33a.

Figure 4:
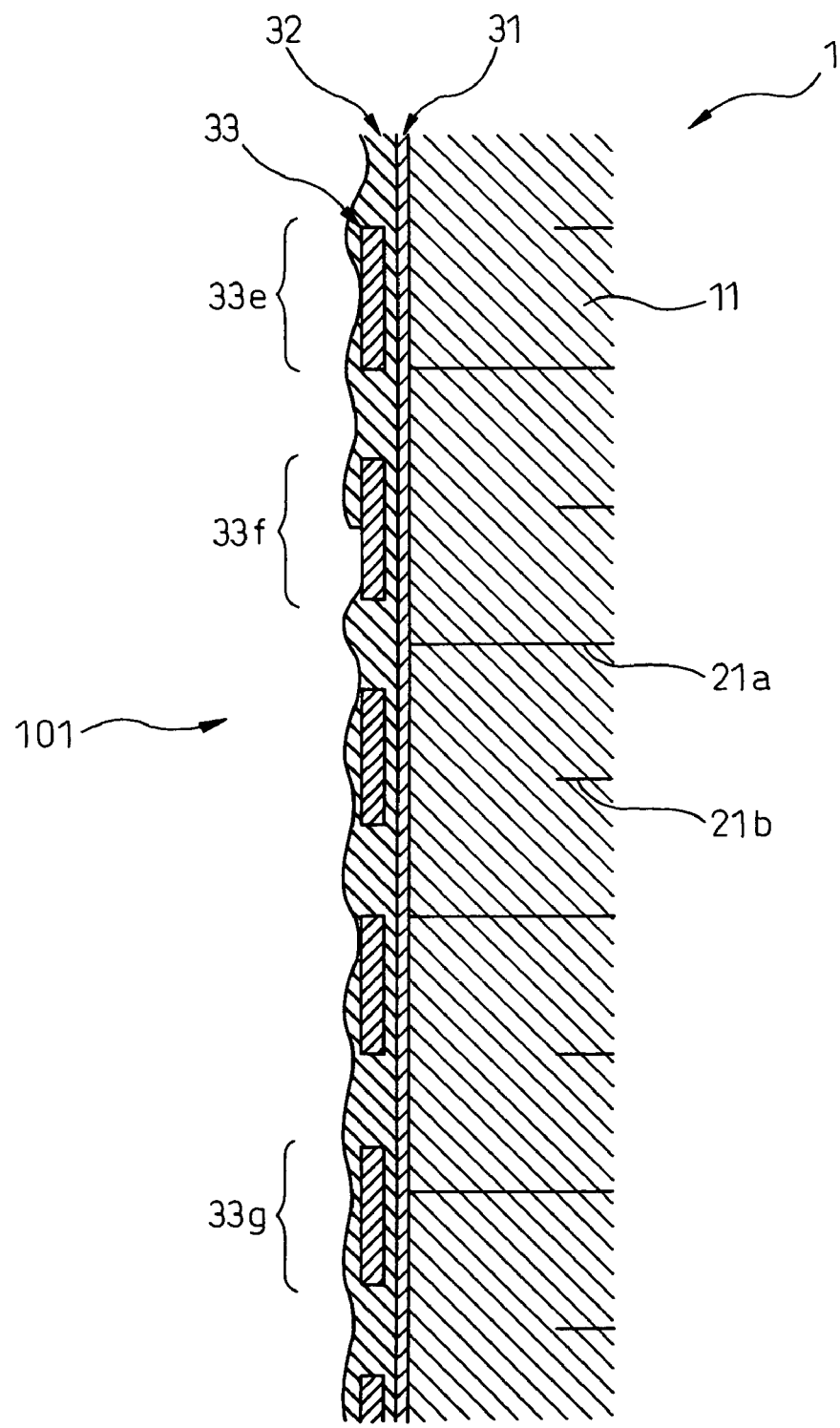
FIG. 4 shows a drawing to illustrate an enlarged view of a main part in FIG. 1.

FIG. 4 is a drawing to illustrate an enlarged view of a main part in FIG. 1. As shown in FIG. 4, in the laminated-type piezoelectric element 1 of this Embodiment, by pressing the first external electrode layer 33 to the electrically conductive adhesive member 32 formed on the second external electrode layer 31 disposed at the external periphery side area 101 of the laminated-type piezoelectric element 1, the electrically conductive adhesive member 32 penetrates into the opening portions 33a of the first external electrode layer 33 to form connections in the shape of an anchor. Therefore, the second external electrode layer 31 and the first external electrode layer 33 can be firmly connected. A connection 33e at both sides in the shape of an anchor shows that the electrically conductive adhesive member 32 penetrating into the opening portion of the first external electrode layer 33 covers the first external electrode layer 33 from both an upward direction and a downward direction in the stacking direction of the laminated-type piezoelectric element 1. A connection 33f at one side in the shape of an anchor shows that the electrically conductive adhesive member 32 penetrating into the opening portion of the first external electrode layer 33 covers the first external electrode layer 33 from the upward direction or the downward direction in the stacking direction of the laminated-type piezoelectric element 1. A connection 33g over the whole area in the shape of an anchor shows that the electrically conductive adhesive member 32 penetrating into the opening portion of the first external electrode layer 33 covers the first external electrode layer 33 from both of the upward direction and the downward direction in the stacking direction of the laminated-type piezoelectric element 1, and bridges over the first external electrode layer 33.

Figure 5:
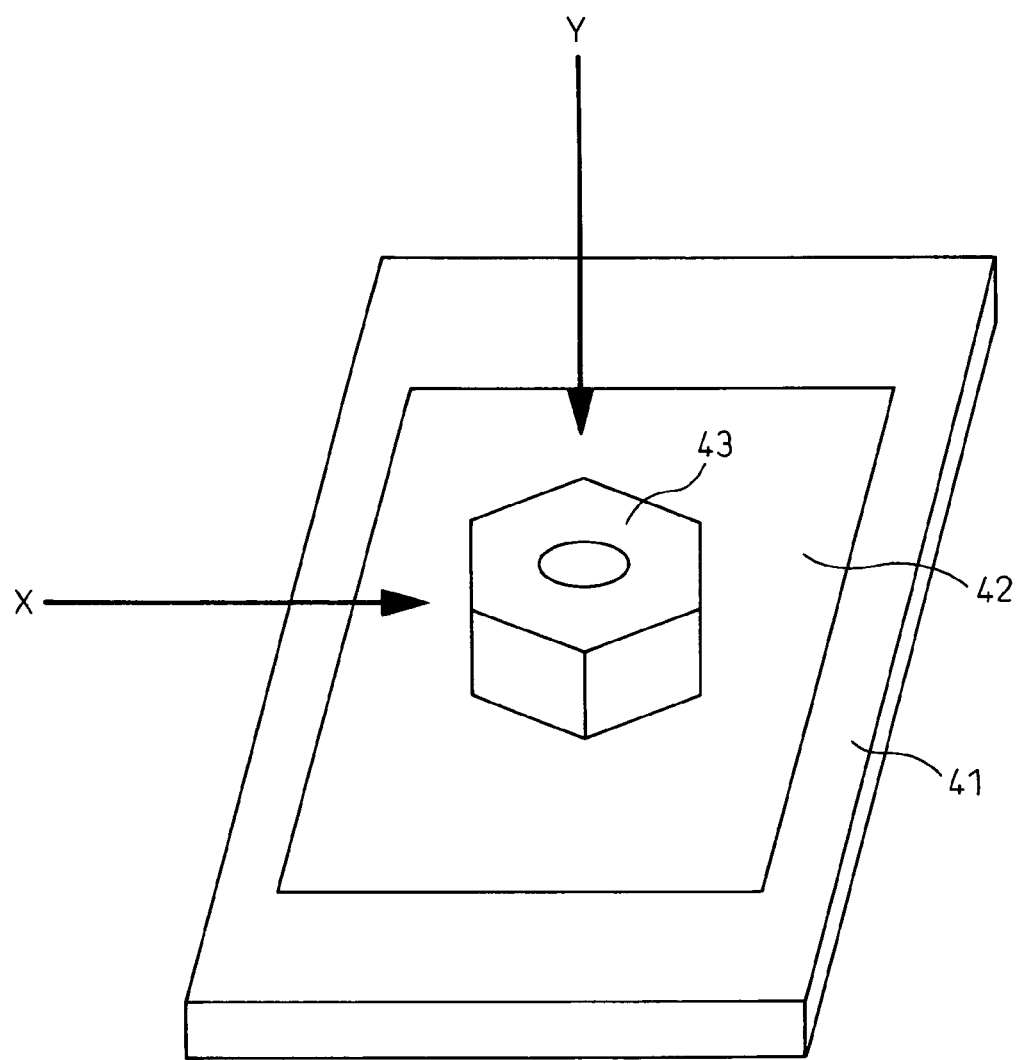
FIG. 5 shows a drawing to illustrate a method for measuring an adhering strength of an electrically conductive adhesive in an Embodiment of the present invention.

FIG. 5 is a drawing to illustrate a method for measuring an adhering strength of the electrically conductive adhesive member 32 in the laminated-type piezoelectric element 1 described in FIGS. 1-4. As shown in FIG. 5, the adhering strength of the electrically conductive adhesive member 32 can be measured as follows. An electrically conductive adhesive 42 is initially applied to a glass plate 41 so that the thickness is uniform (e.g. 0.05 mm). A weight 43 with a specified size (e.g. a stainless nut of M3) is put on it, and a specified load (e.g. 400 g) is applied in the direction of Y. The electrically conductive adhesive 42 is then cured. By using a strength tester (e.g. a push-pull gauge), the weight 43 is pressed in the direction of X at a rate of 5 mm/min, and the strength is measured when the electrically conductive adhesive 42 is broken.

As mentioned above, in this Embodiment, the electrically conductive adhesive member 32 penetrats into the opening portions 33a of the first external electrode layer 33 to form the connection in the shape of an anchor, in order to connect the laminated-type piezoelectric element 1 and the first external electrode layer 33. Therefore, the first external electrode layer 33 is firmly connected to the laminated-type piezoelectric element 1. Further, the width Ws of the electrically conductive adhesive members 32 is narrower than the width Wm of the first external electrode layers 33. Therefore, the electrical conductivity for the internal electrode layers 21a and 21b can be secured by a part of the first external electrode layer 33 which is not fixed to the electrically conductive adhesive member 32, even when a part of the first external electrode layer 33 fixed to the electrically conductive adhesive member 32 was broken by the displacement of the piezoelectric layers 11 and the like. In other words, the electrical conductivity for the internal electrode layers 21a and 21b can be secured by an effect of the side forming at least one opening portion 33a.

Thus, the laminated-type piezoelectric element 1 can be provided, where a connecting strength between the internal electrode layers 21a, 21b formed at the laminated-type piezoelectric element 1 and the first external electrode layer 33 is high, and displacement properties do not easily change even if a part of the first external electrode layer 33 is broken.

Figure 6:
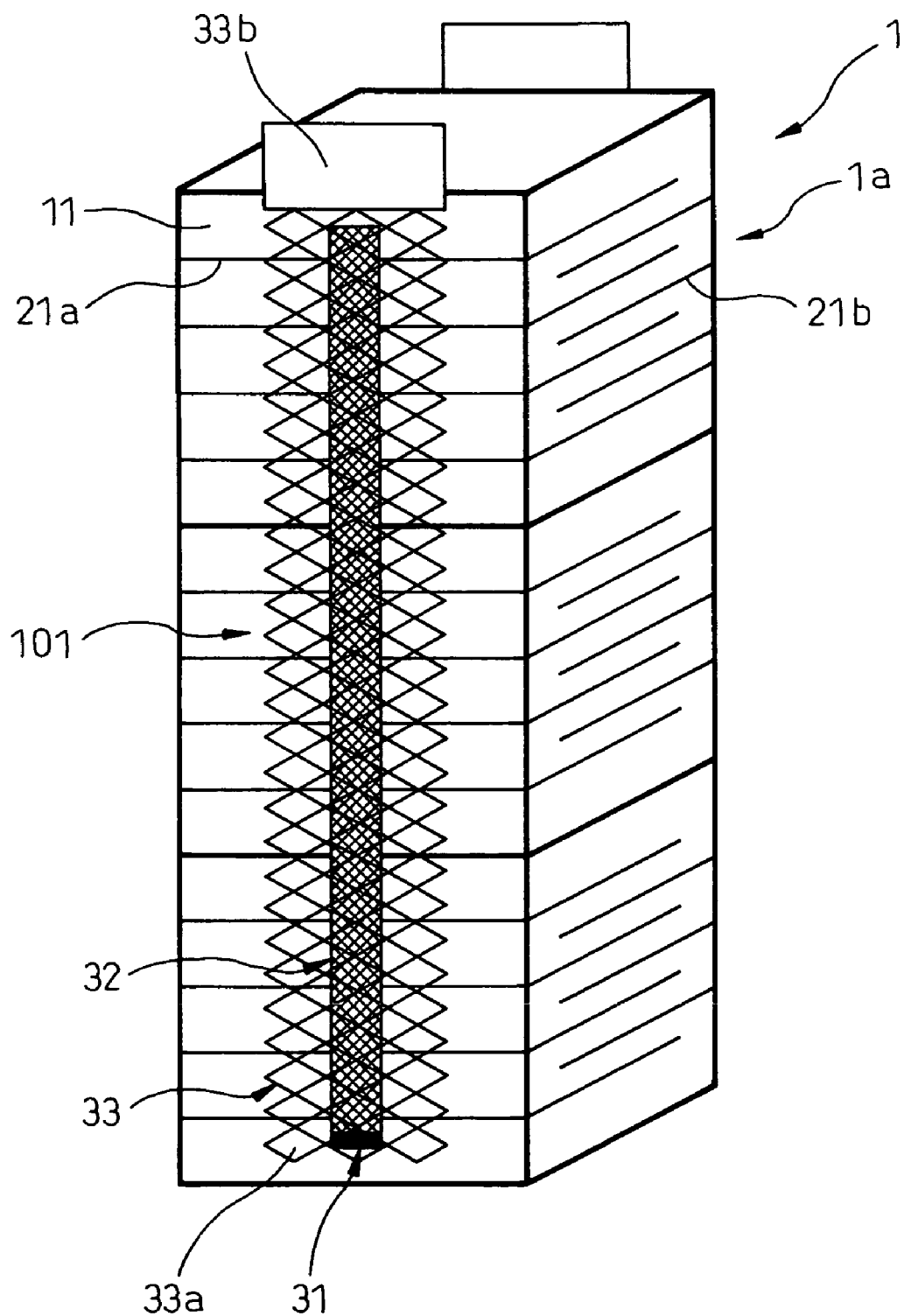
FIG. 6 shows a drawing to illustrate a constitution of a laminated-type piezoelectric element of another Embodiment of the present invention.

FIG. 6 is a drawing to illustrate a constitution of a laminated-type piezoelectric element of another Embodiment of the present invention. As shown in FIG. 6, in the laminated-type piezoelectric element 1 of this Embodiment, plural laminated-type piezoelectric units 1a are connected together. In such a laminated-type piezoelectric element 1, even when a part of the first external electrode layer 33 fixed to the electrically conductive adhesive member 32 was broken, the electrical conductivity for the internal electrode layers 21a and 21b can be secured by a part of the first external electrode layer 33 which is not fixed to the electrically conductive adhesive member 32. In other words, the electrical conductivity for the internal electrode layers 21a and 21b can be secured by the side forming at least one opening portion 33a.

Figure 7:
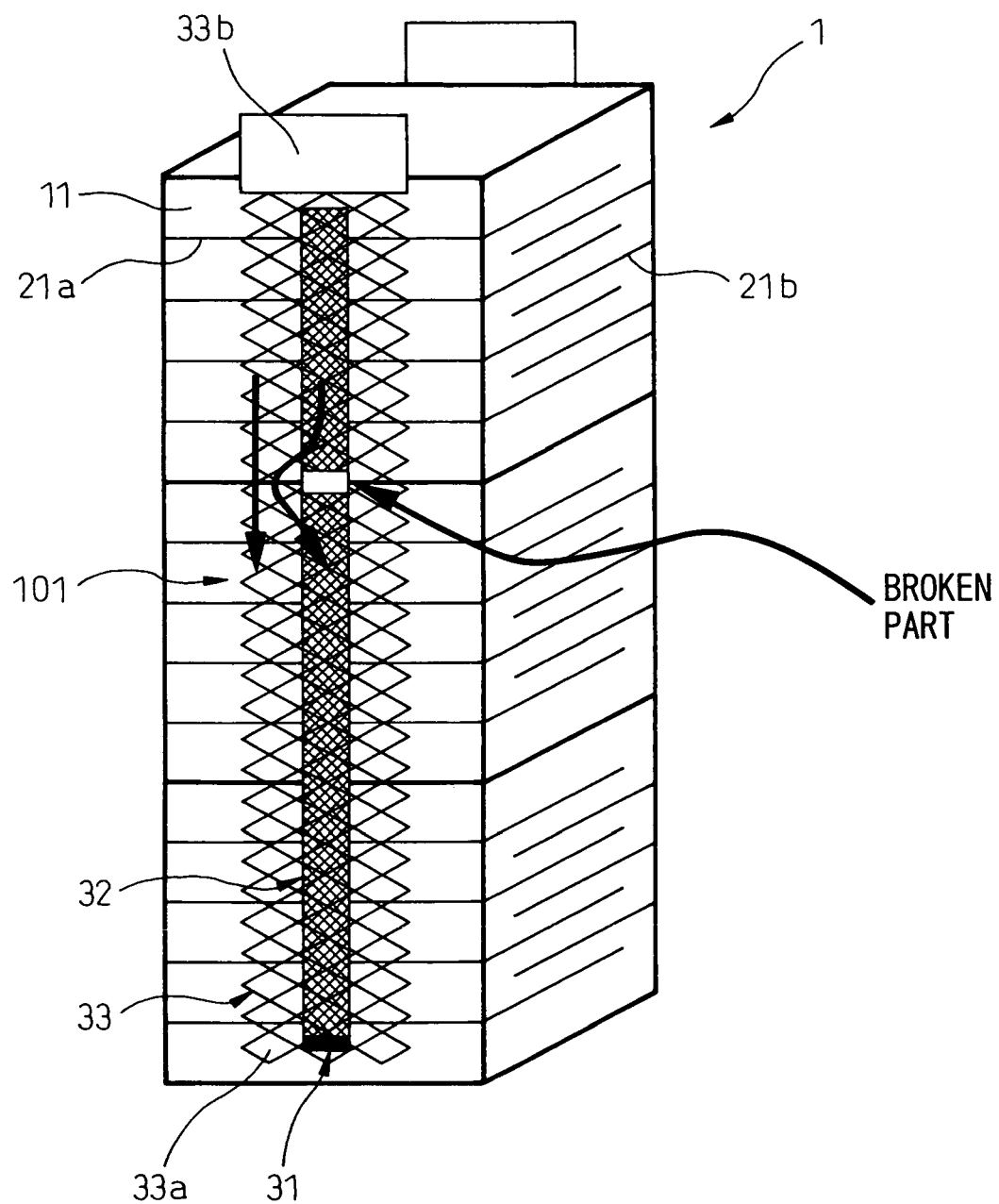
FIG. 7 shows a drawing to illustrate an actuation of a laminated-type piezoelectric element of an Embodiment of the present invention.
Figure 8:
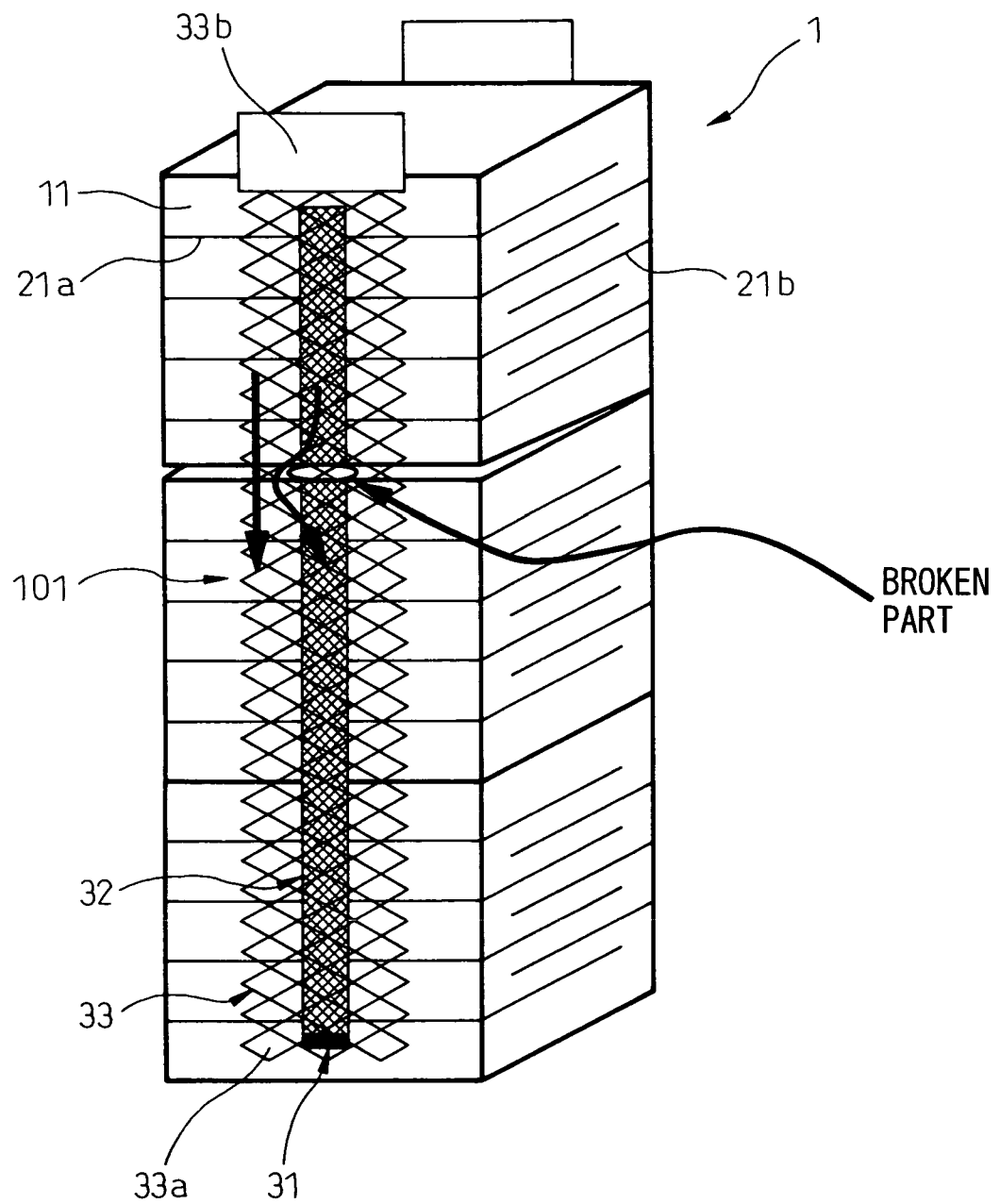
FIG. 8 shows a drawing to illustrate an operation of a laminated-type piezoelectric element of the Embodiment of the present invention.

FIG. 7 and FIG. 8 are drawings to illustrate an actuation of a laminated-type piezoelectric element described in FIG. 6. FIG. 7 shows a state where a part of the first external electrode layer 33 fixed to the electrically conductive adhesive member 32 was broken by the displacement of the piezoelectric layers 11. FIG. 8 shows a state where a part of the electrically conductive adhesive member 32 and a part of the first external electrode layer 33 fixed to the electrically conductive adhesive member 32 were broken by a too large a pulling force which was instantly applied, from the outside, onto the laminated-type piezoelectric element 1. Thus, the electrical conductivity for the internal electrode layers 21a and 21b can be secured by a part of the first external electrode layer 33 which is not fixed to the electrically conductive adhesive member 32, even when a part of the first external electrode layer 33 fixed to the electrically conductive adhesive member 32 was broken. In other words, the electrical conductivity for the internal electrode layers 21a and 21b can be secured by an effect of the side forming at least one opening portion 33a, because the side forming at least one opening portion 33a is not adhered to the electrically conductive adhesive member 32. Similarly, in the laminated-type piezoelectric element 1 described in FIGS. 1-4, the electrical conductivity for the internal electrode layers 21a and 21b can be secured by a part of the first external electrode layer 33 which is not fixed to the electrically conductive adhesive member 32, even when a part of the first external electrode layer 33 fixed to the electrically conductive adhesive member 32 is broken.

Figure 9:
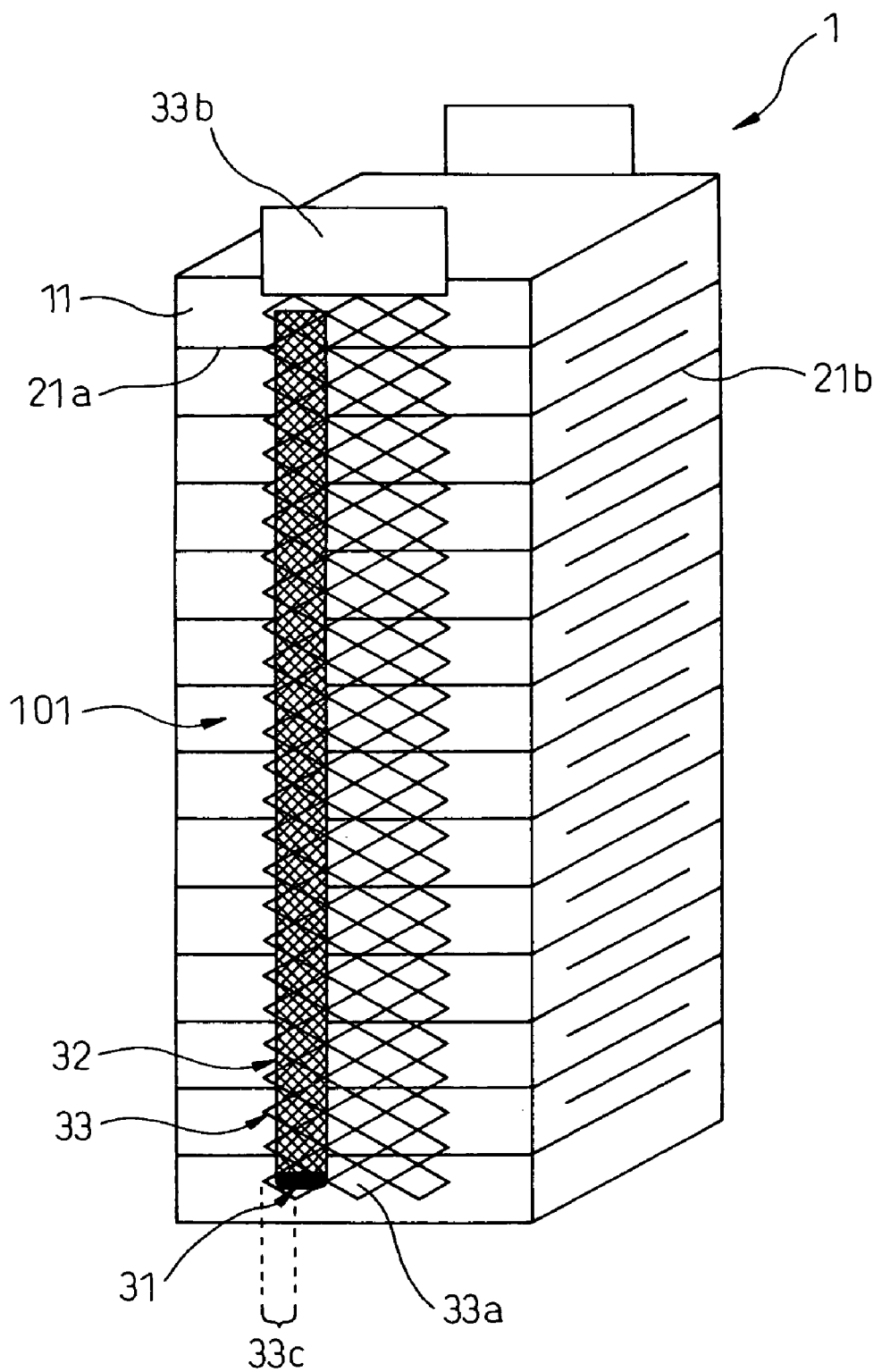
FIG. 9 shows a drawing to illustrate a constitution of a laminated-type piezoelectric element of another Embodiment of the present invention.
Figure 10:
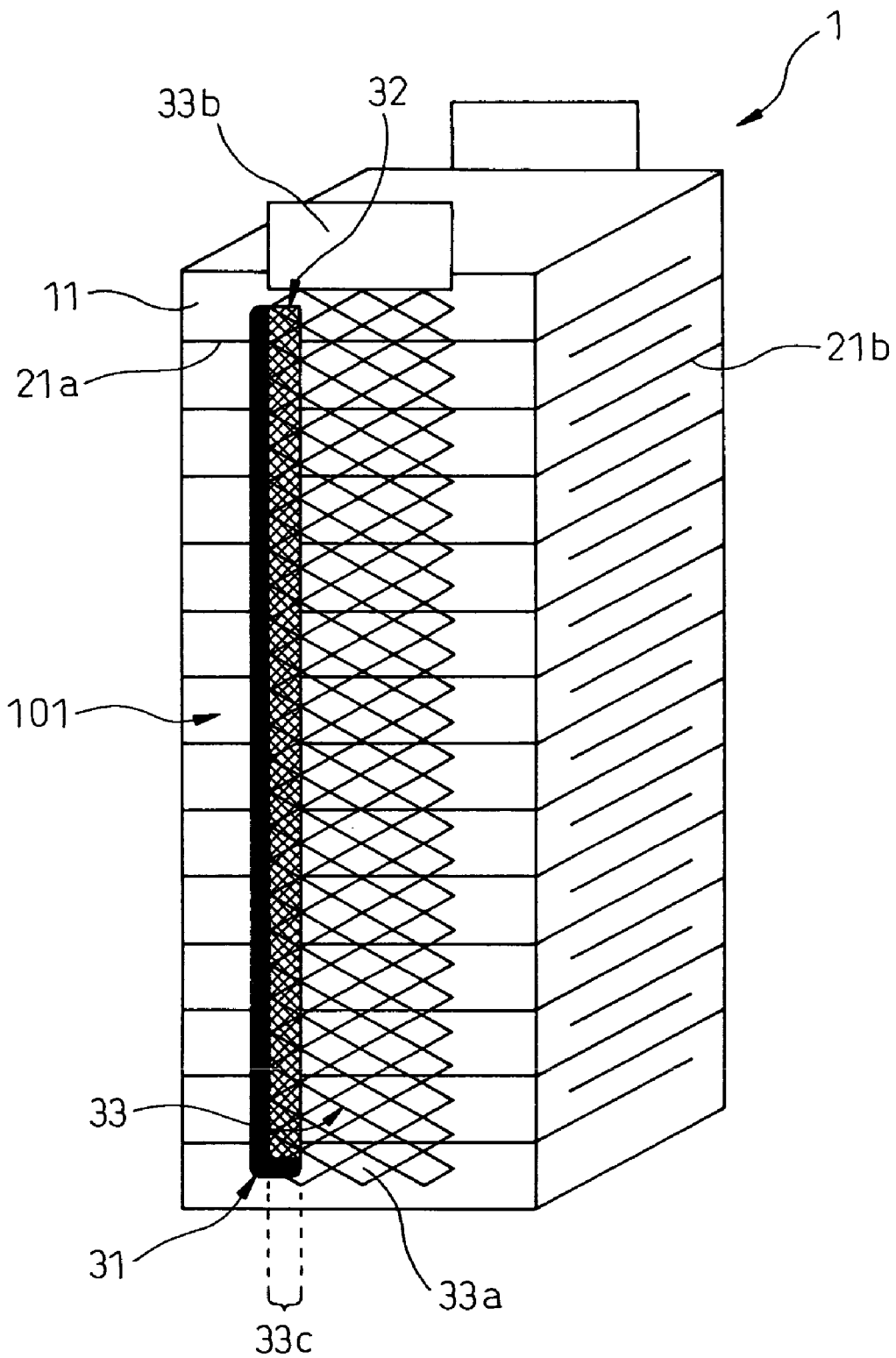
FIG. 10 shows a drawing to illustrate a constitution of a laminated-type piezoelectric element of another Embodiment of the present invention.

FIG. 9 and FIG. 10 are drawings to illustrate a constitution of a laminated-type piezoelectric element of another Embodiment of the present invention. As shown in FIG. 9 and FIG. 10, in the laminated-type piezoelectric element 1 of this Embodiment, a center line of the second external electrode layer 31 and the electrically conductive adhesive member 32 in the stacking direction of the laminated-type piezoelectric element 1 is moved off from a center line of the first external electrode layer 33 in the stacking direction of the laminated-type piezoelectric element 1. The laminated-type piezoelectric element 1 shown in FIG. 9 is formed so that a first external electrode layer's end portion 33c, which is an end side of the first external electrode layer 33 in a perpendicular direction to the stacking direction of the laminated-type piezoelectric element 1, the second external electrode layer 31 and the electrically conductive adhesive member 32 can overlap. The laminated-type piezoelectric element 1 shown in FIG. 10 is formed so that the second external electrode layer 31 and the electrically conductive adhesive member 32, which are disposed further outside of the first external electrode layer's end portion 33c, partly overlap with the first external electrode layer's end portion 33c. According to the laminated-type piezoelectric elements 1 shown in FIGS. 9, 10, it becomes possible to continuously dispose many opening portions 33a which do not contact the electrically conductive adhesive member 32. Therefore, a possibility of a complete breakdown of the first external electrode layer 33 can be reduced, even when the first external electrode layer 33 is broken by a too large pulling force and the like. Further, in the laminated-type piezoelectric elements 1 shown in FIG. 10, as the first external electrode layer's end portion 33c is fixed by the electrically conductive adhesive member 32, when the laminated-type piezoelectric element 1 is supported at a manufacturing step, the first external electrode layer 33 is not easily caught on a supporting device and the like, by supporting the piezoelectric element from a side of the first external electrode layer's end portion 33c. Also in such a laminated-type piezoelectric element 1, the electrical conductivity for the internal electrode layers 21a and 21b can be secured by a part of the first external electrode layer 33 which is not fixed to the electrically conductive adhesive member 32, even when a part of the first external electrode layer 33 fixed to the electrically conductive adhesive member 32 is broken. In other words, the electrical conductivity for the internal electrode layers 21a and 21b can be secured by the side forming at least one opening portion 33a.

Figure 11:
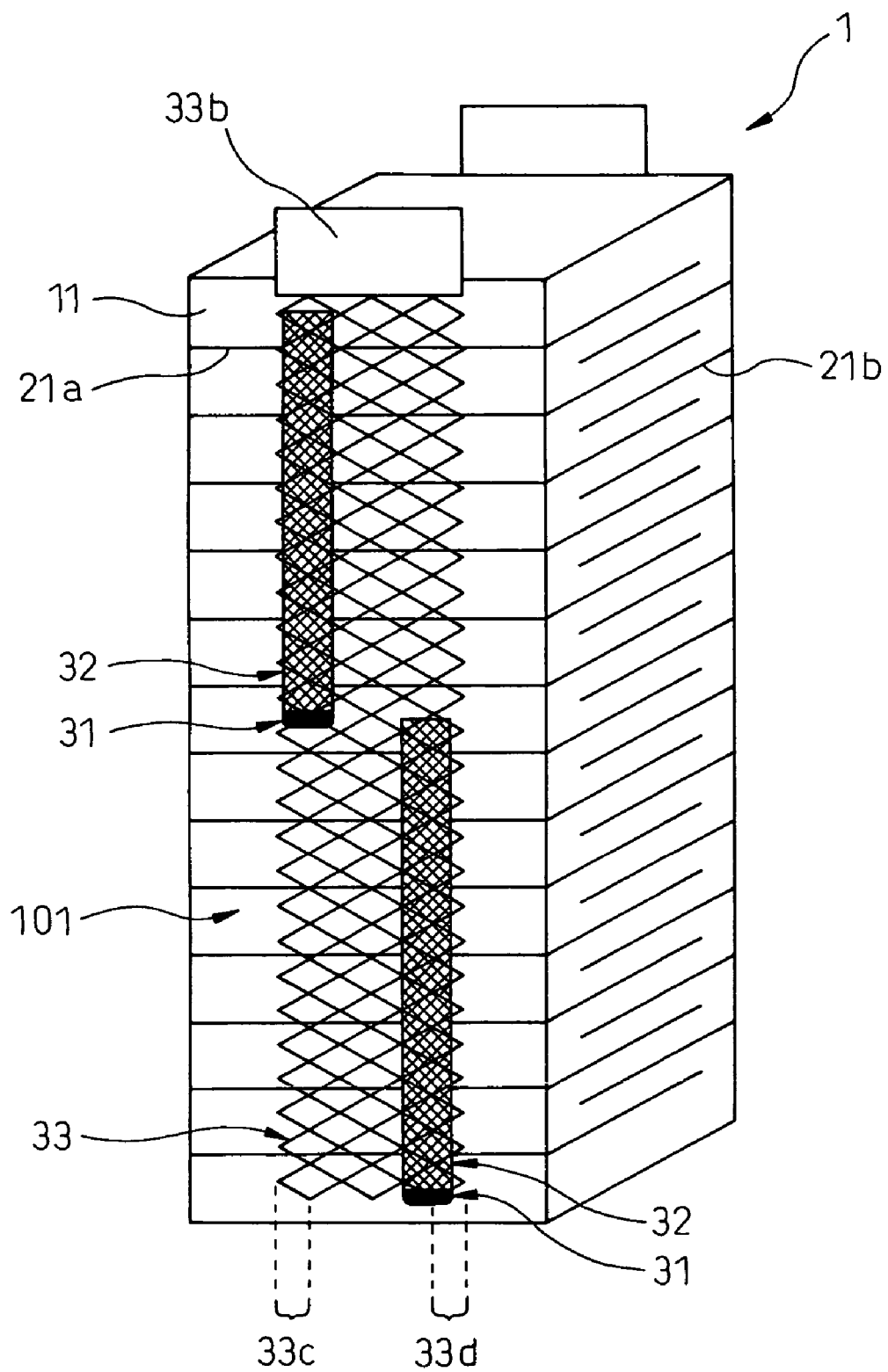
FIG. 11 shows a drawing to illustrate a constitution of a laminated-type piezoelectric element of another Embodiment of the present invention.

FIG. 11 is a drawing to illustrate a constitution of a laminated-type piezoelectric element of another Embodiment of the present invention. In the laminated-type piezoelectric element 1 shown in FIG. 11, the second external electrode layer 31 and the electrically conductive adhesive member 32 are divided into plural parts. The plural parts are disposed in a staggered configuration in a width direction and in a longitudinal direction of the first external electrode layer 33. Concretely, one part of the second external electrode layer 31 and the electrically conductive adhesive member 32 is located at one end side in the longitudinal direction of the first external electrode layer 33, and is disposed at the first external electrode layer's end portion 33c which is an end side in the width direction of the first external electrode layer 33. Another part of the second external electrode layer 31 and the electrically conductive adhesive member 32 is located at another end side in the longitudinal direction of the first external electrode layer 33, and is disposed at the first external electrode layer's end portion 33d which is another end side in the width direction of the first external electrode layer 33.

Figure 12:
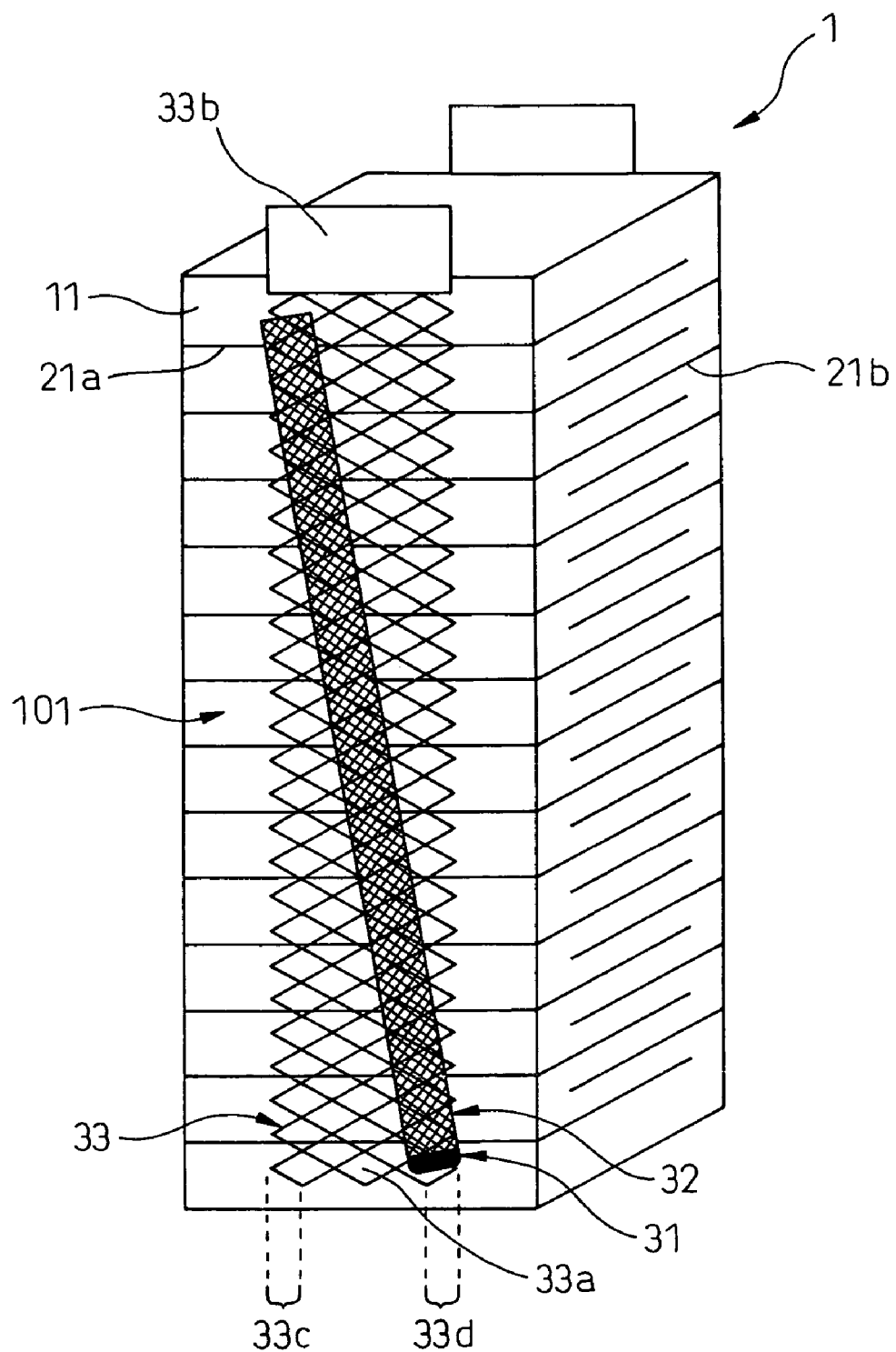
FIG. 12 shows a drawing to illustrate a constitution of a laminated-type piezoelectric element of another Embodiment of the present invention.

FIG. 12 is a drawing to illustrate a constitution of a laminated-type piezoelectric element of another Embodiment of the present invention. In the laminated-type piezoelectric element 1 shown in FIG. 12, the second external electrode layer 31 and the electrically conductive adhesive member 32 are disposed in a direction at a slant to a center line in the longitudinal direction of the first external electrode layer 33. Concretely, the second external electrode layer 31 and the electrically conductive adhesive member 32 is disposed in a shape of a line from one part (the upper left part in the Figure) which is one end of the first external electrode layer 33 in the longitudinal direction and one end of the first external electrode layer's end portion 33c, which is one end of the first external electrode layer 33 in the width direction, to another part (the lower right part in the Figure) which is another end of the first external electrode layer 33 in the longitudinal direction and one end of the first external electrode layer's end portion 33d, which is another end of the first external electrode layer 33 in the width direction.

In the laminated-type piezoelectric elements 1 shown in FIG. 11 and FIG. 12, the first external electrode layer 33 can be fixed entirely in the longitudinal direction and in the width direction. Therefore, a part of the first external electrode layer 33, which is not fixed to the electrically conductive adhesive member 32, is hardly vibrated, and the first external electrode layer 33 is not peeled off, due to a vibration which the laminated-type piezoelectric element 1 receives from the outside.

Figure 13A:
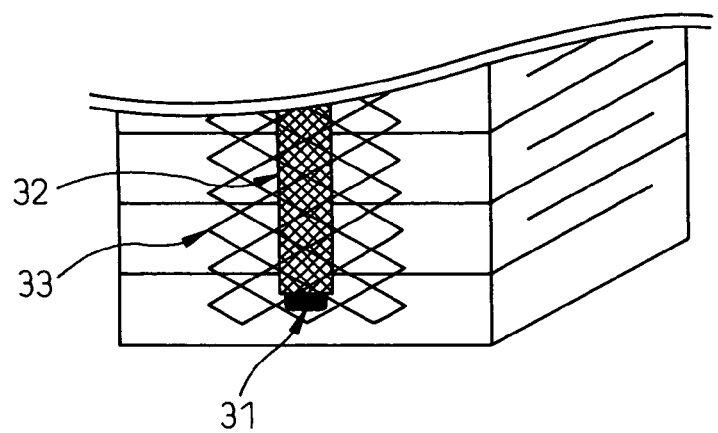
FIG. 13(a) shows a drawing to illustrate a constitution of a laminated-type piezoelectric element of another Embodiment of the present invention.
Figure 13B:
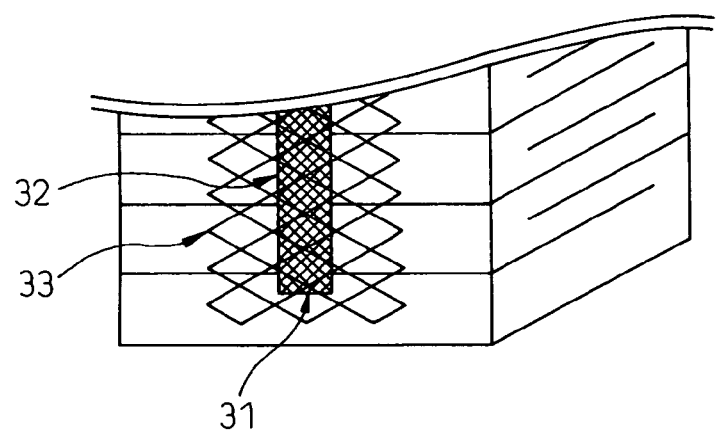
FIG. 13(b) shows a drawing to illustrate a constitution of a laminated-type piezoelectric element of another Embodiment of the present invention.
Figure 13C:
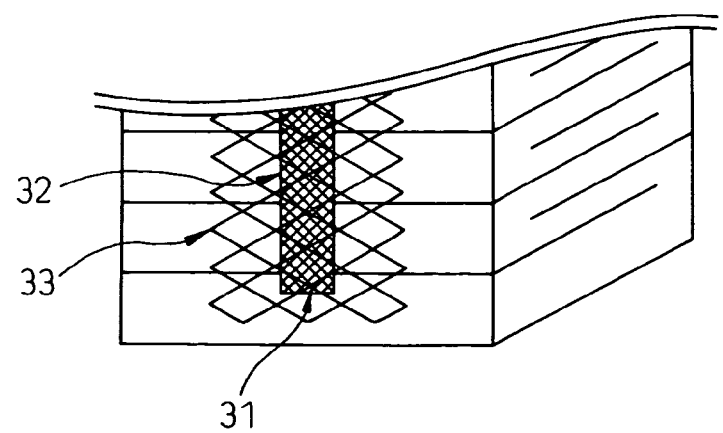
FIG. 13(c) shows a drawing to illustrate a constitution of a laminated-type piezoelectric element of another Embodiment of the present invention.

FIGS. 13(a), 13(b) are drawings to illustrate a constitution of a laminated-type piezoelectric element of another Embodiment of the present invention. The laminated-type piezoelectric element 1 shown in FIGS. 13(a), 13(b) is formed so as to make the width of the second external electrode layer 31 narrower than the width of the electrically conductive adhesive member 32. In FIG. 13(a), the length of the second external electrode layer 31 is longer than the length of the electrically conductive adhesive member 32. In FIG. 13(b), the length of the second external electrode layer 31 (not shown in the Figure) is equal to the length of the electrically conductive adhesive member 32. In FIG. 13(c), the length of the second external electrode layer 31 (not shown in the Figure) is shorter than the length of the electrically conductive adhesive member 32. In the laminated-type piezoelectric element 1 shown in FIG. 13(a), when the electrically conductive adhesive member 32, of which a coefficient of thermal expansion is larger than for the second external electrode layer 31, is contracted in the width direction during at a low temperature, an end portion of the contracted electrically conductive adhesive member 32 is caught on an end portion of the second external electrode layer 31. Therefore, peeling and breaking do not easily occur, and the adhering strength thereof is high. In the laminated-type piezoelectric element 1 shown in FIG. 13(b), the second external electrode layer 31 and the electrically conductive adhesive member 32 are equal in length, and a distance to an end portion of the laminated-type piezoelectric element 1 in the stacking direction can be increased. Therefore, when a metal component exists at an end portion of the laminated-type piezoelectric element 1 in the stacking direction, its electrical insulation can be improved. Further, in the laminated-type piezoelectric element 1 shown in FIG. 13(c), when the electrically conductive adhesive member 32, of which the coefficient of thermal expansion is larger than for the second external electrode layer 31, contracted in the width direction and in the longitudinal direction during at a low temperature, an end portion on the contracted electrically conductive adhesive member 32 is caught on an end portion of the second external electrode layer 31. Therefore, peeling and breaking do not easily occur, and the adhering strength is high. Also in such a laminated-type piezoelectric element 1, the electrical conductivity for the internal electrode layers 21a and 21b can be secured by a part of the first external electrode layer 33 which is not fixed to the electrically conductive adhesive member 32, even when a part of the first external electrode layer 33 fixed to the electrically conductive adhesive member 32 was broken. In other words, the electrical conductivity for the internal electrode layers 21a and 21b can be secured by the side forming at least one opening portion 33a.

Figure 14:
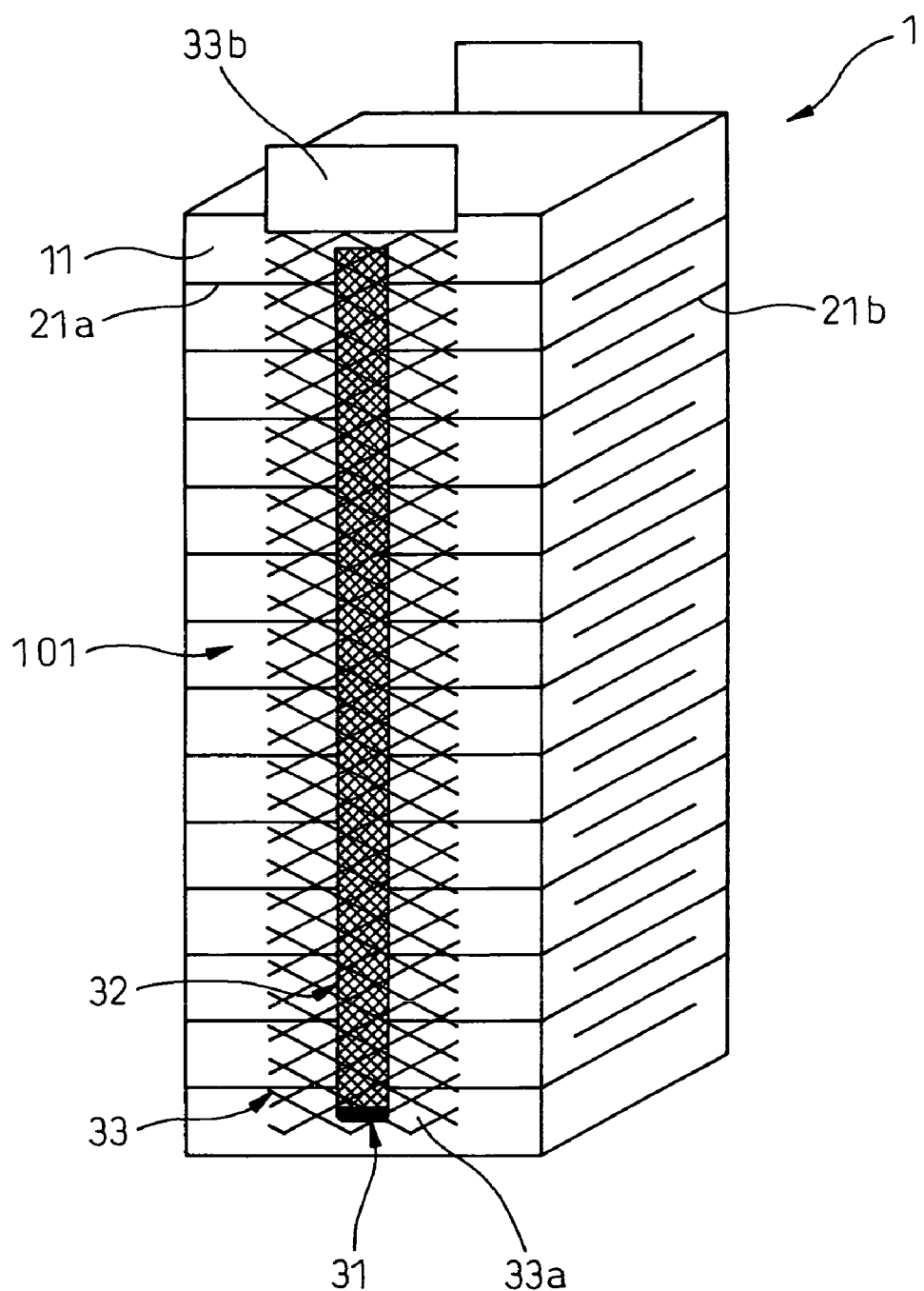
FIG. 14 shows a drawing to illustrate a constitution of a laminated-type piezoelectric element of another Embodiment of the present invention.

FIG. 14 is a drawing to illustrate a constitution of a laminated-type piezoelectric element of another Embodiment of the present invention. As shown in FIG. 14, the laminated-type piezoelectric element 1 of this Embodiment comprise no opening portion 33a at an end portion of the first external electrode layer 33 in the stacking direction and in the perpendicular direction of the laminated-type piezoelectric element 1. In the first external electrode layer 33 of this Embodiment, opening portions approximate in the shape of a quadrangle are formed by making a notch at a first external electrode layer composed of stainless steal, copper, silver, iron, nickel or an alloy thereof, and stretching it. The first external electrode layer obtained on a thin plate is then cut into pieces with a desired width, and utilized. There may be a case where the first external electrode layer cannot be cut at a border line between the opening portions in a shape of a mesh. However, also in such a laminated-type piezoelectric element 1, the electrical conductivity for the internal electrode layers 21a and 21b can be secured by a part of the first external electrode layer 33 which is not fixed to the electrically conductive adhesive member 32, even when a part of the first external electrode layer 33 fixed to the electrically conductive adhesive member 32 was broken. In other words, the electrical conductivity for the internal electrode layers 21a and 21b can be secured by the side forming at least one opening portion 33a.

Figure 15A:
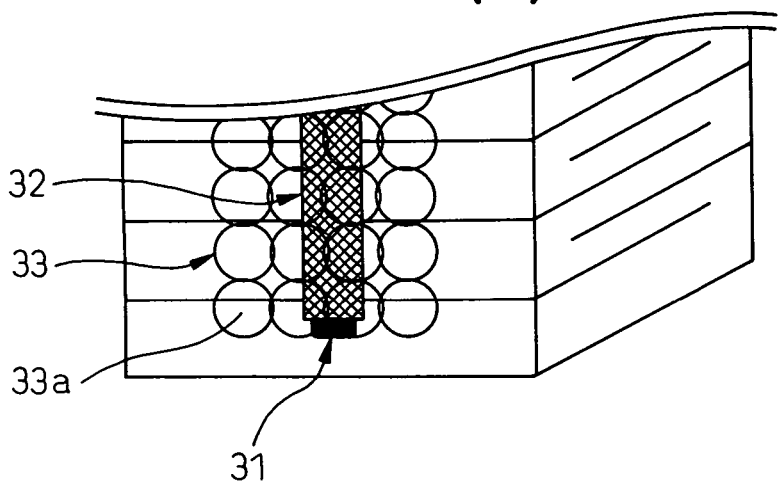
FIG. 15(a) shows a drawing to illustrate a constitution of a laminated-type piezoelectric element of another Embodiment of the present invention.
Figure 15B:
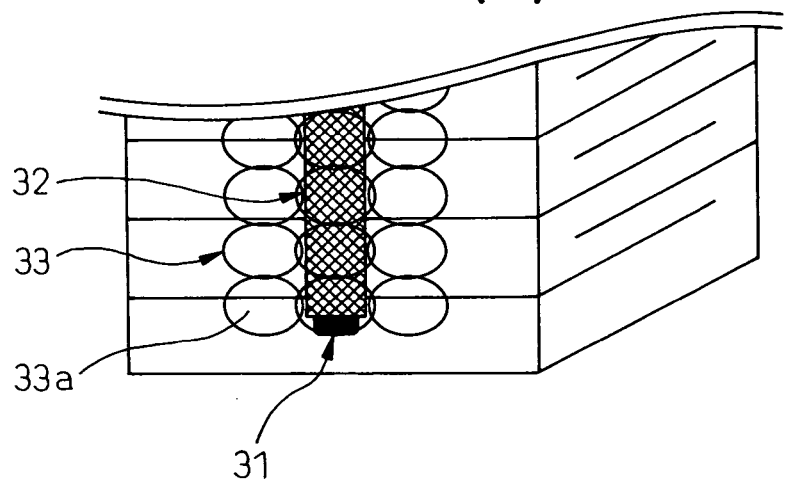
FIG. 15(b) shows a drawing to illustrate a constitution of a laminated-type piezoelectric element of another Embodiment of the present invention.
Figure 15C:
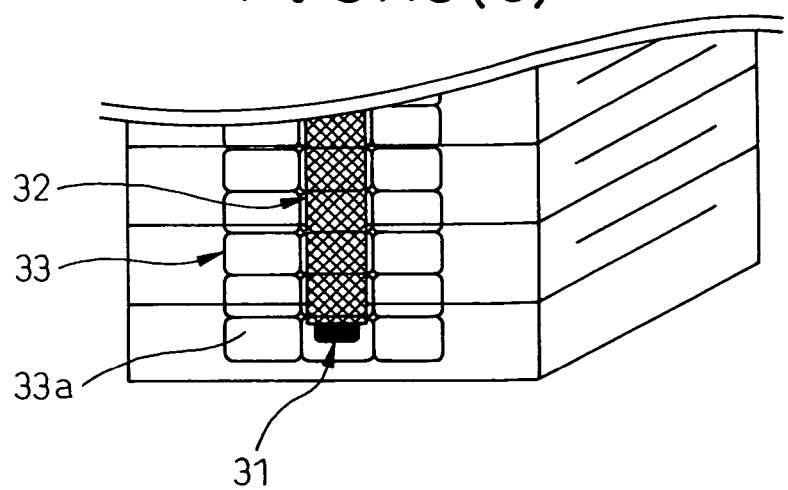
FIG. 15(c) shows a drawing to illustrate a constitution of a laminated-type piezoelectric element of another Embodiment of the present invention.

FIGS. 15(a)-15(c) are drawings to illustrate a constitution of a laminated-type piezoelectric element of another Embodiment of the present invention. In the laminated-type piezoelectric element 1 shown in FIG. 15(a), the opening portions 33a are in a shape of a circle. In the laminated-type piezoelectric element 1 shown in FIG. 15(b), the opening portions 33a are in a shape of an ellipse. In the laminated-type piezoelectric element 1 shown in FIG. 15(c), the opening portions 33a are in a shape of a quadrangle rounded at the corners. As a stress by displacements of the piezoelectric layers and the like does not easily concentrate in any of opening portions 33a with these shapes, breaking of the first external electrode layer can be limited. The shape of the opening portions 33a can be redesigned as appropriate to a triangle, a hexagon, an octagon and the like. In such a laminated-type piezoelectric element 1, the electrical conductivity for the internal electrode layers 21a and 21b can be secured by a part of the first external electrode layer 33 which is not fixed to the electrically conductive adhesive member 32, even when a part of the first external electrode layer 33 fixed to the electrically conductive adhesive member 32 was broken. In other words, the electrical conductivity for the internal electrode layers 21a and 21b can be secured by the side forming at least one opening portion 33a.

As mentioned above, in this Embodiment, the electrically conductive adhesive member 32 connecting the laminated-type piezoelectric element 1 and the first external electrode layer 33 penetrates into the opening portions of the first external electrode layer 33 to form connections in the shape of an anchor. Therefore, the first external electrode layer 33 connects firmly to the laminated-type piezoelectric element 1. Further, the width Ws of the electrically conductive adhesive members 32 is narrower than the width Wm of the first external electrode layers 33. Therefore, even when a part of the first external electrode layer 33 fixed to the electrically conductive adhesive member 32 was broken by displacements of the piezoelectric layers 11 and the like, the electrical conductivity for the internal electrode layers 21a and 21b can be secured by a part of the first external electrode layer 33 which is not fixed to the electrically conductive adhesive member 32. In other words, the electrical conductivity for the internal electrode layers 21a and 21b can be secured by the side forming at least one opening portion 33a. Therefore, the laminated-type piezoelectric element 1 can be provided, where a connecting strength between the internal electrode layers 21a, 21b formed at the laminated-type piezoelectric element 1 and the first external electrode layer 33 is high, and displacement properties do not easily change even if a part of the first external electrode layer 33 was broken.

The constitutions utilized in the present invention are not limited to these Embodiments, if they can resolve the problems for the present invention. For example, the piezoelectric layers 11 are not limited to in the shape of a quadrangle, and may be in the shape of a polygon such as an octagon and the like.

Figure 16:
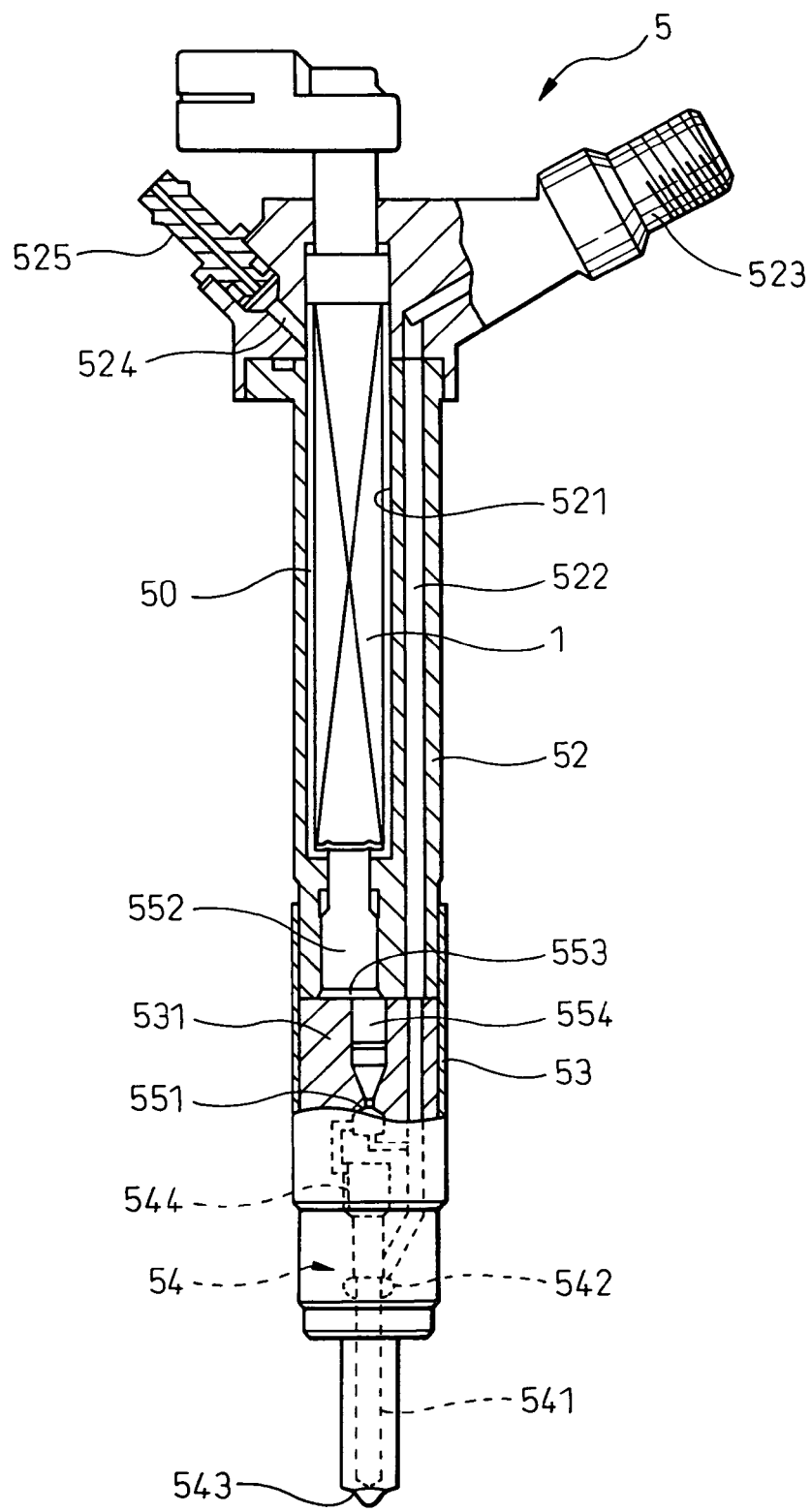
FIG. 16 shows a drawing to illustrate a constitution of a common rail-type injection system of a diesel engine including a laminated-type piezoelectric element of the present invention.

FIG. 16 is a drawing to illustrate a constitution of an example where a laminated-type piezoelectric element of the present invention is utilized to a common rail-type injection system of a diesel engine. As shown in FIG. 16, an injector 5 has an upper housing 52 where the above-mentioned laminated-type piezoelectric element 1 is installed as a driving part, and a lower housing 53 fixed to the lower end of the upper housing where an injection nozzle portion 54 is formed internally.

The upper housing 52 is in a shape of an approximately circular cylinder, and the laminated-type piezoelectric element 1 is inserted and fixed inside of a longitudinal hole 521 which is away from the center axis. At the side of the longitudinal hole 521, a high-pressure fuel passage 522 is placed in parallel, and the upper end thereof is provided with a communication passage through a fuel introduction pipe 523, which protrudes at upper side of the upper housing 52, to an external common rail (omitted in the Figure).

The upper housing 52 is also protrudingly provided with a fuel outflow pipe 525 with a communication passage to a drain passage 524, and fuel flowing out from the fuel outflow pipe 525 is returned to a fuel tank (omitted in the Figure). The drain passage 524 is provided with a communication passage through a gap 50 between the longitudinal hole 521 and the driving part (the laminated-type piezoelectric element) 1 to a three-way valve 551 described later via a passage (omitted in the Figure) stretching from this gap 50 downwards in the upper housing 52 and the lower housing 53.

The injection nozzle portion 54 is provided with a nozzle needle 541 sliding up or down in a piston body 531, and a injection slot 543 injecting the high-pressure fuel, which is supplied from a fuel reservoir 542 opened/closed by the nozzle needle 541, to each cylinder of the engine. The fuel reservoir 542 is equipped on the periphery of the middle portion of the nozzle needle 541, and a bottom end portion of the high-pressure fuel passage 522 is opened there. The nozzle needle 541 receives fuel pressure in the valve-opening direction from the fuel reservoir 542, and also receives fuel pressure in the valve-closing direction from a back pressure chamber 544 provided facing the upper end area. When the pressure of the back pressure chamber 544 decreases, the nozzle needle 541 lifts, the injection slot 543 is opened, and the fuel is injected.

The pressure of the back pressure chamber 544 is increased or decreased by the three-way valve 551. The three-way valve 551 is configured so as to be selectively provided with a communication passage with the back pressure chamber 544 and the high-pressure fuel passage 522 or the drain passage 524. A valve member in the shape of a ball which opens or closes a port with a communication passage to the high-pressure fuel passage 522 or the drain passage 524 is disposed here. This valve member is driven by the driving part 1 via a piston 552 with a large diameter disposed at a lower position of the driving part, an oil pressure chamber 553 and a piston 554 with a small diameter.

Characteristic of the laminated-type piezoelectric element 1 in this Embodiment is that the electrically conductive adhesive member 32 connecting the laminated-type piezoelectric element 1 and the first external electrode layer 33 penetrates into the opening portions of the first external electrode layer 33 to form connections in the shape of an anchor. Therefore, the first external electrode layer 33 is firmly connected to the laminated-type piezoelectric element 1 even in a severe environment such as for the injector 5. Further, the width Ws of the electrically conductive adhesive members 32 is narrower than the width Wm of the first external electrode layers 33. Therefore, even when a part of the first external electrode layer 33 fixed to the electrically conductive adhesive member 32 was broken by displacements of the piezoelectric layers 11 and the like, the electrical conductivity for the internal electrode layers 21a and 21b can be secured by a part of the first external electrode layer 33 which is not fixed to the electrically conductive adhesive member 32, and the reliability of the laminated-type piezoelectric element 1 is high. Thus, the laminated-type piezoelectric element 1 for the injector, which can be utilized with a high reliability under a severe environment, can be provided.

We claim:

1. A laminated-type piezoelectric element, comprising piezoelectric layers composed of a ceramic being expansible and contractible by an applied electric voltage, internal electrode layers which are stacked alternately with the piezoelectric layers to form the laminated-type piezoelectric element, and supply the electric voltage to the piezoelectric layers, and
first external electrode layers which are disposed on side areas of the laminated-type piezoelectric element, are electrically continuous to the internal electrode layers, and comprise plural opening portions being expansible and contractible in a stacking direction of the laminated-type piezoelectric element,
wherein the first external electrode layer is connected to the laminated-type piezoelectric element via an electrically conductive adhesive member which has penetrated into the plural opening portions, and
a width of the electrically conductive adhesive member is narrower than a width of the first external electrode layer.

2. The laminated-type piezoelectric element according to claim 1, wherein the width of the electrically conductive adhesive member is not less than 0.3 mm.

3. The laminated-type piezoelectric element according to claim 1, wherein a maximum width of the opening portion in a perpendicular direction to the stacking direction of the laminated-type piezoelectric element is not greater than 0.5 Wm, wherein Wm represents the width of the first external electrode layer.

4. The laminated-type piezoelectric element according to claim 1, wherein a shape of the opening portion is a circle or an ellipse.

5. The laminated-type piezoelectric element according to claim 1, wherein a shape of the opening portion is a polygon rounded at the corners.

6. The laminated-type piezoelectric element according to claim 1, wherein a shape of the opening portion is a quadrangle or a lozenge.

7. The laminated-type piezoelectric element according to claim 6, wherein a width Ws of the electrically conductive adhesive member is represented by the following formula, $$Ws < Wm - h$$

wherein Wm represents a width of the first external electrode layer, and h represents a height of a triangle with three sides of a, b and $L_2$, wherein a and b represent respectively lengths of two sides adjoining to each other in the stacking direction at the opening portion formed in the shape of a quadrangle or a lozenge, and $L_2$ represents a width of the opening portion in the stacking direction of the laminated-type piezoelectric element.

8. The laminated-type piezoelectric element according to claim 7, wherein a relation among three sides of the triangle is represented by the following formula, $$a+b>L_2\times\alpha$$

wherein α represents an extensibility (maximum extension/total length) of the laminated-type piezoelectric element in the stacking direction.

9. The laminated-type piezoelectric element according to claim 1, wherein a maximum extensibility (maximum extension/total length) of the laminated-type piezoelectric element in the stacking direction is not greater than 0.012.

10. The laminated-type piezoelectric element according to claim 1, wherein the first external electrode layer is composed of a metal composed of at least one metal selected from stainless steel, copper, silver, iron and nickel, or an alloy thereof.

11. The laminated-type piezoelectric element according to claim 1, wherein a non-opening portion, where the opening portion is not formed, is formed at an end portion of the first external electrode layer.

12. The laminated-type piezoelectric element according to claim 1, wherein a second external electrode layer intervenes between the electrically conductive adhesive member and the first external electrode layer.

13. The laminated-type piezoelectric element according to claim 12, wherein the second external electrode layer is composed of a metal composed of at least one metal selected from silver, palladium, platinum, copper, gold and nickel, or an alloy thereof.

14. The laminated-type piezoelectric element according to claim 1, wherein an insulating resin member intervenes in a gap between the first external electrode layer and the internal electrode layer, which is formed by that the width of the electrically conductive adhesive member is narrower than the width of the first external electrode layer.

15. The laminated-type piezoelectric element according to claim 14, wherein the insulating resin member is composed of a silicone resin, an epoxy resin, a urethane resin, a polyimide resin, a polyamideimide resin or a polyester resin.

16. The laminated-type piezoelectric element according to claim 1, wherein the laminated-type piezoelectric element is formed by connecting laminated-type piezoelectric units.

17. The laminated-type piezoelectric element according to claim 1, wherein the laminated-type piezoelectric element is utilized for a fuel injection device.

18. The laminated-type piezoelectric element according to claim 1, wherein electrically conductive adhesive member which has penetrated into the plural opening portions covers at least a portion of the first external electrode layer.

19. A laminated-type piezoelectric element, comprising
piezoelectric layers composed of a ceramic being expansible and contractible by an applied electric voltage,
internal electrode layers which are stacked alternately with the piezoelectric layers to form the laminated-type piezoelectric element, and supply the electric voltage to the piezoelectric layers, and
first external electrode layers which are disposed on side areas of the laminated-type piezoelectric element, are electrically continuous to the internal electrode layers, and comprise plural opening portions being expansible and contractible in a stacking direction of the laminated-type piezoelectric element,
wherein the first external electrode layer is connected to the laminated-type piezoelectric element via an electrically conductive adhesive member, and
a width of the electrically conductive adhesive member is narrower than a width of the first external electrode layer,
wherein a shape of the opening portions is a circle or an ellipse.

20. A laminated-type piezoelectric element, comprising
piezoelectric layers composed of a ceramic being expansible and contractible by an applied electric voltage,
internal electrode layers which are stacked alternately with the piezoelectric layers to form the laminated-type piezoelectric element, and supply the electric voltage to the piezoelectric layers, and
first external electrode layers which are disposed on side areas of the laminated-type piezoelectric element, are electrically continuous to the internal electrode layers, and comprise plural opening portions being expansible and contractible in a stacking direction of the laminated-type piezoelectric element,
wherein the first external electrode layer is connected to the laminated-type piezoelectric element via an electrically conductive adhesive member, and
a width of the electrically conductive adhesive member is narrower than a width of the first external electrode layer,
wherein a shape of the opening portions is a polygon rounded at the corners.

* * * * *